(12) United States Patent
Seurin et al.

(10) Patent No.: US 8,783,893 B1
(45) Date of Patent: Jul. 22, 2014

(54) OPTICAL ILLUMINATOR

(71) Applicant: Princeton Optronics Inc., Mercerville, NJ (US)

(72) Inventors: Jean F. Seurin, Princeton Junction, NJ (US); Chuni L Ghosh, West Windsor, NJ (US); Qing Wang, Plainsboro, NJ (US); Laurence S. Watkins, Pennington, NJ (US)

(*) Notice: Subject to any disclaimer, the term of this patent is extended or adjusted under 35 U.S.C. 154(b) by 0 days.

(21) Appl. No.: 14/166,664

(22) Filed: Jan. 28, 2014

Related U.S. Application Data

(62) Division of application No. 13/541,906, filed on Jul. 5, 2012, now Pat. No. 8,675,706.

(51) Int. Cl.
    *F21V 29/00*     (2006.01)
    *F21V 29/02*     (2006.01)
    *F21L 4/02*     (2006.01)

(52) U.S. Cl.
    CPC .......... *F21L 4/02* (2013.01); *F21V 29/022* (2013.01); *F21V 29/30* (2013.01); *F21V 29/22* (2013.01)
    USPC .......................................... 362/157; 362/227

(58) Field of Classification Search
    CPC ...... F21V 23/003; F21V 23/004; F21V 23/40
    USPC .................................................. 362/157, 227
    See application file for complete search history.

(56) References Cited

U.S. PATENT DOCUMENTS

2010/0219736 A1*   9/2010   Dahm ............................ 313/46

* cited by examiner

*Primary Examiner* — David V Bruce
(74) *Attorney, Agent, or Firm* — Sonali Banerjee

(57) ABSTRACT

VCSEL arrays with planar electrical contacts readily adaptable for surface mounting are provided. Monolithic VCSEL arrays are configured in array patterns on two and three-dimensional surfaces for configuring optical illuminator modules. Illuminator modules are easily expandable by increasing the array size or by modularly arranging more arrays with or without a transparent substrate, in different shapes by tiling array modules monolithically on a common substrate, or by tiling small modules. The surface mountable illuminator modules are easily assembled on a thermally conductive surface that may be air or liquid cooled for efficient heat dissipation. Array modules may be integrated with other electronic circuits such as current drivers, sensors, controllers, processors, etc. on a common platform, for example, a single or multiple layer printed circuit boards (PCB) to assemble illumination systems for different applications including a gesture recognition apparatus and a battery operated portable illuminator devices.

20 Claims, 23 Drawing Sheets

OPTICAL ILLUMINATOR

CROSS REFERENCE TO RELATED APPLICATION

This application is a Divisional of the U.S. patent application Ser. No. 13/541,906 filed on Jul. 5, 2012, which is a Continuation-In-Part of the U.S. patent application Ser. No. 13/337,098 filed on Dec. 24, 2011, and Continuation-In-Part of the U.S. patent application Ser. No. 13/369,581 filed on Feb. 9, 2012, issued as the U.S. Pat. No. 8,576,885 on Nov. 5, 2013, to van Leeuwen et al. Disclosures of the above mentioned applications and patent are being incorporated by reference in their entirety.

BACKGROUND OF THE INVENTION

1. Field of the Invention

The present invention relates to optical illumination systems and in particular to an optical illuminator using arrays of Vertical Cavity Surface Emitting Lasers (VCSEL) configured with a three dimensional illumination surface.

2. Related Background Art

Optical illumination is widely used in a large number of applications whether applied to reflect incident optical radiation, such as optical imaging, or medical imaging, etc. or applied to absorb incident radiation, such as optical pumping of a gain medium in a solid state laser. New and more efficient optical sources are emerging that may be suitable for applications that require small foot print, higher uniformity, high speed or quasi-continuous wave (QCW) illumination, just to name a few. One such class of new optical sources is configured using Vertical Cavity Surface Emitting Lasers (VCSEL) and arrays of VCSELs.

One advantage of VCSELs is that the divergence angle of emitted light is very small. Consequently, emission from VCSELs is highly directional even at large distances from the origin. VCSEL emission in visible and infrared wavelengths may be obtained in a very narrow wavelength band allowing optically efficient filtering of background noise. VCSELs are also amenable to generating short pulses, thereby making these sources suitable for LIDAR type applications and for time domain distance discrimination applications such as seeing through fog and motion and gesture detection, etc.

Current technology for packaging VCSELs is quite complex. In most instances, packages typically have electrical leads that are designed for through hole mounting on electronic circuit boards and are described in many prior art patent and non-patent literature publications. In a co-authored and co-owned pending U.S. patent application Ser. No. 13/337, 098 filed on Dec. 24, 2011, by Seurin et al, a surface mount packaging is disclosed, the content of which is hereby incorporated by reference in its entirety. More specifically, a single VCSEL and/or arrays of VCSELs are mounted on a thermal submount and then installed in surface mountable housing. The thermal submount may be bonded to a thermal substrate, or in a housing including external cooling devices, by solder or epoxy. The VCSEL or arrays of VCSELs are electrically connected to the submount and to the package conductor pads, using wire or ribbon bonding.

Similar approach of a surface submount is also disclosed in other patents and patent application publications. For example, in the U.S. Pat. No. 7,777,173 issued to Price et al. on Aug. 10, 2010, in the United States Patent Application Publication No. 2003/0185499 A1 by Butler et al. published on Oct. 2, 2003, and in United States Patent Application Publication No. 2006/0088254 A1 by Mohammed published on Apr. 27, 2006. In some of the submounts described in the cited prior art, additional optical elements are included for controlling beam shape.

The beam divergence of VCSEL is quite small and typically has a Gaussian or pseudo-Gaussian distribution. Depending on the application it is often required to adjust the illumination pattern by either increasing the divergence or by changing the distribution from the Gaussian distribution to approximately a top-hat distribution. In other types of mounting configuration well known in the art, a diffuser to adjust a beam distribution pattern is used. For example, in the U.S. Pat. No. 5,946,121 issued to Jiang et al, on Aug. 31, 1999, use of a diffuser attached to the package lid to increase the divergence of a single emitter in a data link application is described. In the United States Patent Application Publication No. 2008/0310852 by Tan et al, published on Dec. 18, 2008, a diffuser is provided to compensate for misalignment in an optical communications transmitter comprising a single VCSEL emitter.

Diffusers alone, or in combination with other optical components, are used with VCSEL and VCSEL arrays as described in many other publications. A diffuser to reduce the coherence in an array of different colored emitter for electronic imaging is disclosed in a U.S. Pat. No. 6,950,454 issued to Kruschwitz on Sep. 27, 2005. However, no detailed description is provided about how the diffuser is attached in the system especially since the diffuser has to be vibrated to eliminate speckle effects. In the United States Patent Application Publication No. 2008/0079904 by Bartlett, published on Apr. 3, 2008, layouts of VCSEL arrays in combination with diffuser in complex alignment with other optical components, is described to generate a uniform illumination beam.

In a different application described in the U.S. Pat. No. 7,150,552 issued to Weidel on Dec. 19, 2006, a diffuser is placed close to the collection lens to obtain a uniform beam from a VCSEL array. In all of the above examples, the diffuser is an additional optical component bonded to a separate fixture, located a distance away from the laser emitter and requires accurate alignment and positioning.

In other arrangements, a diffuser may be placed in close proximity to the VCSEL or VCSEL array. For example, in the U.S. Pat. No. 7,949,022 issued to Miesak et al on May 24, 2011, a diffuser plate in placed proximal to a VCSEL array for optically pumping a solid state laser. The diffuser is close to the VCSEL array but requires a separate mounting to hold it in place between the VCSEL array and the solid-state laser crystal. In an alternative arrangement, individual diffusers separately bonded to each VCSEL in an array is described in the United States Patent Application Publication No. 2003/0026310 by Valliath, published on Feb. 6, 2003. This approach requires aligning each diffuser individually over the emitter and then bonding it in place. For larger arrays having many emitting devices the assembly procedure becomes very expensive.

In this invention a robust and efficient surface mountable optical illuminator is provided that can be used as a surface mount component or as a stand-alone module. The illuminator comprises VCSEL array(s) bonded to a transparent carrier substrate (carrier substrate hereinafter) which seals the emission surface and also provides a robust support. One advantage of the surface mountable packaging option is to avoid wire or ribbon bonding of VCSEL arrays that may become a cause of device failure over long run and that increase module costs. The emitting or non-emitting surface of the VCSEL or VCSEL arrays may be integrated with electronic circuit(s) to electrically connect illuminator module to a drive and/or control circuit(s) on a circuit board using standard surface mounting methods.

The carrier substrate is designed to optionally include optical components such as microlenses, diffusers, etc. The VCSEL array with the carrier substrate may be adapted for surface mounting on a circuit board or a submount as the application demands. In one adaptation of the invention, surface mountable VCSEL arrays may be disposed on a surface of a three dimensional member adapted for surface cooling using a circulating fluid for example, a gas including air, or a liquid. In another adaptation, a three dimensional configuration is used as a portable illuminating device. The optical illuminator as disclosed in this invention does not require intricate alignment of optical components with individual VCSELs in the array, thereby is readily adaptable for high throughput manufacturing.

SUMMARY OF THE INVENTION

In one embodiment of the invention a VCSEL array illuminator module is provided that is designed for surface mounting either alone, or integrated with electronic circuit(s) on a circuit board, for example a printed circuit board (PCB) or on a heat management equipment. VCSEL array module comprises a VCSEL array chip and a carrier substrate configured to function as a protective window on the emitting surface. In a variant embodiment, the carrier substrate window includes additional optical elements for providing beam shaping functions.

One aspect of the invention is to provide an electrical contact from the emitter side to the non-emitter side of the array chip, such that both the terminals of the array chip are accessible on the same side of the module, thereby providing surface mounting capability. Advantageously, an optical module constructed according to this invention eliminates the need for wire or ribbon bonding, and/or via holes through the substrate.

According to one aspect of the invention, surface mountable array modules are provided by connecting the emitter side terminal of the array chip to a connector pad on the non-emitter side of the array chip by an additional metal connector or a metal track, deposited in an open window or a trench in the VCSEL array chip. The additional metal track connects the emitter side terminal to the connector pad on the non-emitter side using a connector bridge on the metal pad on the carrier substrate. In another embodiment, an electrical contact from the emitter side to the non-emitter side of the array chip is provided by using a metal bump on the non-emitter side of the array chip. Advantageously, the surface mounting connector pads are configured in a co-planar form without wire or ribbon bonding or via holes through the substrate by a wafer level process prior to dicing and separating of the individual arrays.

One aspect of the invention provides metal bonding pads on the carrier substrate that are aligned with corresponding metal bonding pads on the VCSEL array chip, such that the carrier substrate and the VCSEL array chip are reliably bonded for example, using metal-to-metal planar contacts. The bonding pads on the carrier substrate may be designed to bond more than one array chip that are electrically connected in parallel or in series. To expand the size of the array module or to increase the output optical power, the array chips are arranged in tiles. In a variant embodiment, the array chips are tiled to configure array module of specific shapes. As one aspect of the invention the tiling processes may be performed at chip or wafer level.

In another embodiment, multiple array modules are assembled to modularly expand the illumination area and/or power output. Multiple array modules bonded to a respective carrier substrate may be assembled individually on a common submount including a thermally conducting submount. In an alternative embodiment, a plurality of array chips are bonded to a single carrier substrate and electrically connected using additional metal tracks specifically designed to provide parallel or series connectivity for expanding the array module.

In another variant embodiment the array chips are designed to have planar contacts that are adaptable for surface mounting. An array chip may be designed to include one or more VCSEL arrays that may be electrically connected in parallel or series to configure larger array chips. A larger array chip is then bonded in a single bonding operation, to a carrier substrate having corresponding metal bonding pads so as to configure an array module.

In a different embodiment, an optical illuminator comprising one or more VCSEL array modules is provided. The optical illuminator may be configured as a surface mountable module or as a stand-alone illuminator by integrating electronic circuit(s) with the illuminator module on a common printed circuit board (PCB). The electronic circuit(s) provides operation and control functions, such as drive current and/or logic control, signal detection, etc. to the illuminator. The array module and the electronic circuit(s) are adapted for surface mounting. Electrical connection between the array module and one or more electronic circuit(s) may be provided on a common level of the PCB, or on multiple levels of a multi-level PCB. Advantageously, the illuminator modules provided in this invention may be expanded in a modular fashion to increase the surface area and/or optical power output.

In one embodiment of the invention an illuminator module is surface mounted with or without one or more electronic circuit(s) on a common thermally conductive platform to provide a means for heat management. Thermally conductive platform may be designed to include elements that would reduce parasitic electrical components and in particular, the inductance of the driving circuit for high speed or Quasi Continuous Wave (QCW) operation of the illuminator module. Thermally conductive platform may be further attached to a heat dissipation surface that may be air cooled or liquid cooled.

In a different embodiment, an illuminator module is provided with encapsulation. The encapsulation may be applied to an array module or a group of array modules assembled on a common platform or to an array module or a group of array modules in combination with one or more electronic circuit(s) assembled on a PCB. Encapsulation may be applied to perform additional optical functions such as a focusing lens or as a window. In a variant embodiment, the encapsulation may be provided using an enclosure having a window. The window may include additional optical components for providing beam shaping functions. In yet another embodiment, the substrate of the VCSEL array module may be shaped to provide microlenses on the emitter surface.

One aspect of the invention is to provide an illuminator module configured in a system with one or more electronic components or circuits for specific applications. In one embodiment a motion or gesture recognition apparatus is provided by integrating an illuminator module with a sensor device and operating and control electronics. Advantageously, the small form factor of the apparatus is conducive for portability and inclusion in a variety of consumer devices requiring a motion or gesture recognition capability.

In another embodiment a portable illuminator is provided. The VCSEL array chips are provided on a water cooled surface of a three dimensional structure, for example a hemispherical object, to provide a wide angle illumination of a scene. Advantageously, the small form factor portability facilitates airborne operation of the portable illuminator in certain scene illumination applications. Alternatively, illuminator may be adapted for other three dimensional shapes depending upon the application that may include portable or stationary illumination, motion sensor, and gesture recognition.

BRIEF DESCRIPTION OF THE DRAWINGS

Different aspects of the invention describing a broad framework of the invention are presented in the specification which will be better understood and appreciated in conjunction with the drawing figures in which—

DETAILED DESCRIPTION OF THE INVENTION

Various aspects of this invention representing a broad framework of the principles will be described using exemplary embodiments and represented in different drawing figures. For clarity and ease of description, each embodiment includes only a few aspects. However, different aspects presented in each embodiment may be practiced separately or in various combinations. Many different combinations and sub-combinations of the representative embodiments within the broad framework presented in this written specification, may be apparent to those skilled in the art but not explicitly shown or described, should not be construed as precluded.

VCSEL Array Chip

Figure 1:
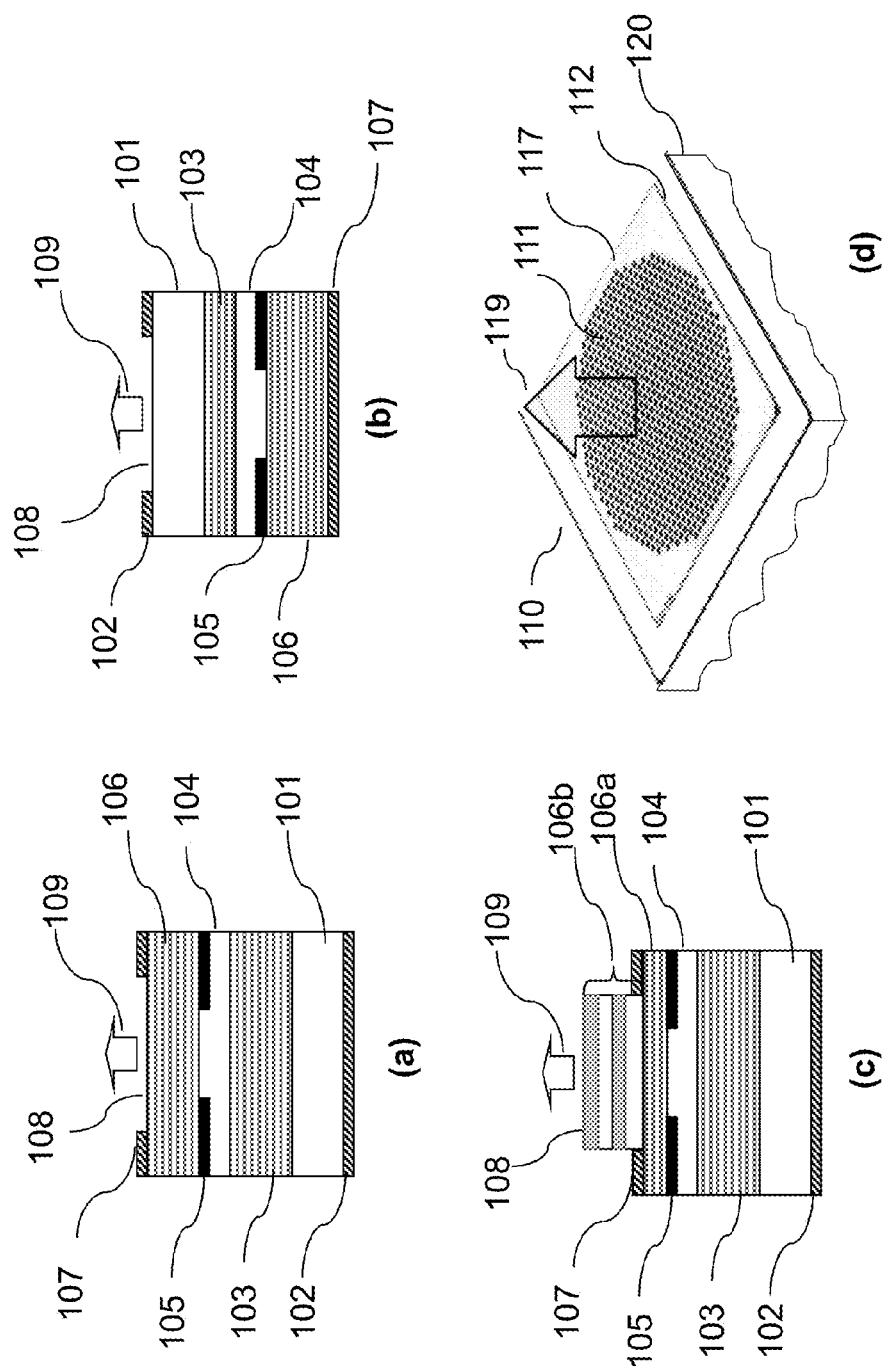
FIG. 1 is a schematic representation of a VCSEL device configured in a) front illumination mode, b) back illumination mode and c) a hybrid output reflector device, and d) a two dimensional array of a plurality of VCSEL devices.

Referring now to FIG. 1, there it shows several individual VCSEL devices and a VCSEL array constructed of VCSEL devices that are used in configuring optical illuminators to be described in detail. For clarity and ease of description, only basic two terminal VCSEL devices emitting in a direction perpendicular to plane of the substrate, are shown here. It should be noted that other advanced VCSEL devices emitting perpendicular to the substrate plane are equally applicable for constructing VCSEL array illuminator and are not precluded.

In FIGS. 1a, 1b and 1c elements that are labeled using same reference numerals are either identical or provide similar functions. A description in reference with any reference numeral is equally pertinent for a similar element in all the embodiments. More specifically, a simple two terminal VCSEL device shown in FIGS. 1a, 1b and 1c is constructed on a substrate 101. Each device comprises a light emitting region including an optical gain region 104 comprising one or more quantum well p-n junctions. More advanced VCSEL devices may also include other types of junctions, such as a tunnel junction, a homojunction, a heterojunction, etc., that are well known in the art. The light emitting region in these examples is constructed by epitaxial growth. It may be understood that the light emitting region may often be referred synonymously as epitaxial region in the following description.

The light emitting region comprises the optical gain region disposed in a vertical laser cavity formed by reflectors 103 and 106, respectively. The reflectors may include but are not limited to, semiconductor distributed Bragg reflector (DBR), dielectric mirrors, optical gratings or a combination thereof. For example, in FIG. 1c, commonly known as an "intra-cavity contacted" structure, reflector 106 is a hybrid reflector comprising two sections, a semiconductor distributed Bragg reflector (DBR) 106a and a dielectric coating reflector 106b. Electrical contact layers 102 and 107 to the VCSEL structure is provided respectively, on the substrate side and on the reflector 106 (in FIGS. 1a and 1b) and on the semiconductor reflector 106a (FIG. 1c). The electrical contacts function as the terminals for the VCSEL device.

A current confinement aperture 105 controls the flow of drive current to the light emitting region and also determines the emission area and the shape of emission beam, as has been described in the co-authored and co-owned pending U.S. patent application Ser. No. 13/337,098 by Seurin et al., filed on Dec. 24, 2011. That description is incorporated by reference in its entirety. The current confining aperture can be formed via a selective oxidation process, an implantation process, a buried tunnel junction process, a re-growth process, or other methods that are well known in the art. In these examples the devices are shown with their respective substrates. It is a common practice to reduce the thickness of the substrate or completely remove the substrate to reduce absorption of the emitted light in the substrate (in devices where the substrate would absorb the emitted light completely), and for facilitating efficient heat dissipation.

Light emission 109 from the device may be output from a window 108 that may be placed on the reflector side, or from the substrate side. More specifically, light emission is from the window 108 located on the reflector 106 and 106b, respectively, in the 'top' emission devices shown in FIGS. 1a and 1c whereas light emission is from the window 108 located on the substrate side in the bottom emitting device shown in FIG. 1b, respectively. It should be noted that the bottom emitting device shown in FIG. 1b is mounted with the substrate side up such that the light emission in the devices is in an upward direction (arrow 109). The convention for upward emission followed here is exemplary and not to be construed as limiting.

It can be appreciated by those skilled in the art that instead of a single VCSEL device, an array of multiple VCSEL devices may be constructed monolithically on a single common substrate as shown in FIG. 1d. More specifically, a device 110 shown therein comprises a two-dimensional array 111 of a plurality of VCSEL devices (each dot represents a VCSEL device) similar to those shown in FIGS. 1a, 1b and 1c, constructed on a common substrate. In this particular example, the VCSEL devices are arranged to form a circular array chip. It can be appreciated that array chips may be configured in any regular geometric pattern or in a random shape. All the VCSELs in the array are electrically connected to the substrate which functions as a first common terminal 112 of the array. In order for the VCSELs to emit collectively, the second electrical contact of each VCSEL in the array is connected using a common metallization 117 disposed contiguously on the array surface which functions as a second common terminal of the array. The common metallization has a plurality of windows substantially aligned with the current confining apertures of the respective VCSEL devices in the array.

In this example, all the VCSEL devices in the array emit collectively in an upward direction shown by the arrow 119. For the ease of description, the VCSEL array as shown in FIG. 1d will be referred as VCSEL array chip (or array chip hereinafter). It may be recalled that the VCSELs in the array chip may be top or bottom emission types; accordingly the array chip needs to be mounted substrate down or up, respectively. Irrespective of the top or bottom emission devices in the array chip, for the clarity and ease of discussion and not as a limitation, following convention is adopted; the emission surface of the array chip will be referred as the emission end or top end of the array chip whereas, the opposite end will be referred as the non-emission end or bottom end of the array chip. Similar convention will be followed for a top and bottom contact of the array chip. In the example shown in FIG. 1d, the first common terminal or the bottom contact 112 is located on the non-emission end, whereas the second common terminal or the top contact 117 is located on the emission end.

The array chip may be further mounted on a heat dissipating device 120 with its non-emission end in contact with the heat sink. The heat dissipating device may include but is not limited to, a thermal submount similar to ones described in the co-authored and co-owned pending U.S. patent application Ser. No. 13/337,098 by Seurin et al., filed on Dec. 24, 2011. That description is being incorporated by reference in its entirety. Heat dissipating device may be cooled by a fluid for example, a gas including air, or liquid, depending upon the size and the output optical power of the array chip.

It is noted that the two terminals of the exemplary array chip shown in FIG. 1d are located on two opposite ends (emission and non-emission ends) of the array chip. This aspect is more clearly depicted in cross section schematic views shown in FIG. 2. In the embodiments shown in FIGS. 2a-2d, identical elements are labeled with same reference numeral to keep the description clear and short. Each element will be described once and that description is equally pertinent to all the embodiments shown in FIG. 2, unless mentioned otherwise. The top and bottom ends (and electrical contacts) of the array chip will be referred with respect to the emission surface following the convention developed in reference with FIG. 1d.

Referring now to FIGS. 2a-2d, an array chip is constructed on a common substrate 201 in each instance. For clarity of representation, the VCSEL array active layer comprising the light emitting region, the current confining region and the reflectors (respectively, 104, 105, 103, 106 in FIGS. 1a and 1b and 1c) is collectively represented as 220. In the top emission configuration of the array chip shown in FIG. 2a, the bottom contact 202 on the non-emission side forms a common first terminal of the array chip. The bottom contact is a continuous metallization layer which is electrically connected to the conducting substrate (201) in this example.

The top contact disposed on the active layer on the emission side forms a common second terminal of the array chip. The top contact comprises a continuous metallization layer having emission windows 208 (only one labeled for clarity) created by selective etching (or selective deposition). The metallization between the windows form the top metal contact pads 207 (only one labeled) for making electrical connections. Each window (208) is aligned with a corresponding current confinement aperture of a VCSEL located directly below.

In the bottom emission configuration shown in FIG. 2b, the array chip is placed upside down such that the non-emission side contact 202 electrically connected to the active layer forms a common first terminal. The top metallization layer on the emission side is disposed on the substrate 201 and has a plurality of windows 208 (only one labeled). The remaining metallization layer contiguous between the windows form electrical contact pads 207 (only one labeled) for making electrical connections. Each window (208) is substantially aligned with a corresponding current confinement aperture in the active layer located directly underneath. The top metallization layer forms a common second terminal for the array chip. The array chip in bottom emission mode is upside down, such that the emission is from the substrate end in an upward direction (209). However, the example shown here in this configuration is not to be construed as limiting.

In the array chips shown in FIGS. 2a and 2b, the first and second terminals are located on the opposite sides of the emission surface. In order to facilitate surface mounting, it is desirable to have both the electrical terminals as planar contacts located on the same side. FIGS. 2c and 2d show two embodiments where the first and second terminals are located on the same side. More specifically, the array chip is mounted in the bottom emission mode in the embodiments shown in FIGS. 2c and 2d, (similar to the embodiment shown in FIG. 2b); however, it should not be construed as a limitation.

In the embodiment shown in FIG. 2c, a window 221 or a trench is created by selectively removing a part of the bottom contact 202 and the active layer 220 underneath. It is noted that a common general meaning of a 'trench' namely, a narrow and long opening on a surface, where the length of the opening is substantially larger than the width, applies in this context as well. An additional metallization layer 222 is selectively deposited on the non-emission side of the substrate 201. The metallization layer 222 is supported on the part of the active layer that is physically and electrically separated from the rest of the active layer of the array chip by the window 221. The conductive substrate having contact on both sides in this configuration electrically connects the metallization layer 222 to the top contact 207 through current flow in the substrate. Thus, the two terminals of the array chip (222 and 202) having substantially the same height, are co-planar on the same side of the array chip, thereby facilitating surface mounting of the array chip.

The embodiment shown in FIG. 2d is slightly different; a portion of the bottom contact 202 and the active layer underneath is selectively removed. An electro-plated gold bump 223 substantially equal in height to the active layer 220 and the contact layer 202, is then deposited on the non-emission side of the substrate 201 leaving a gap 221 between the array chip active layer and the gold bump 223. Thus the conductive substrate having contact on both sides in this configuration electrically connects the gold bump 223 to the top contact 207 through current flow in the substrate. Therefore the two terminals of the array chip are co-planar on the same side. In the configurations described in FIGS. 2c and 2d, the gap 221 may optionally be filled with an insulating or a polymeric material using a process step known as 'planarizing' in the art.

Although the concept of surface mountable VCSEL array chip is demonstrated using a bottom emitting array chip, the same concept is equally applicable for top emitting array chip. As mentioned earlier, the substrate may be thinned down or entirely removed to reduce absorption of the emitted light in the substrate (in devices where the substrate would absorb the emitted light completely), and for facilitating efficient heat dissipation.

Figure 2:
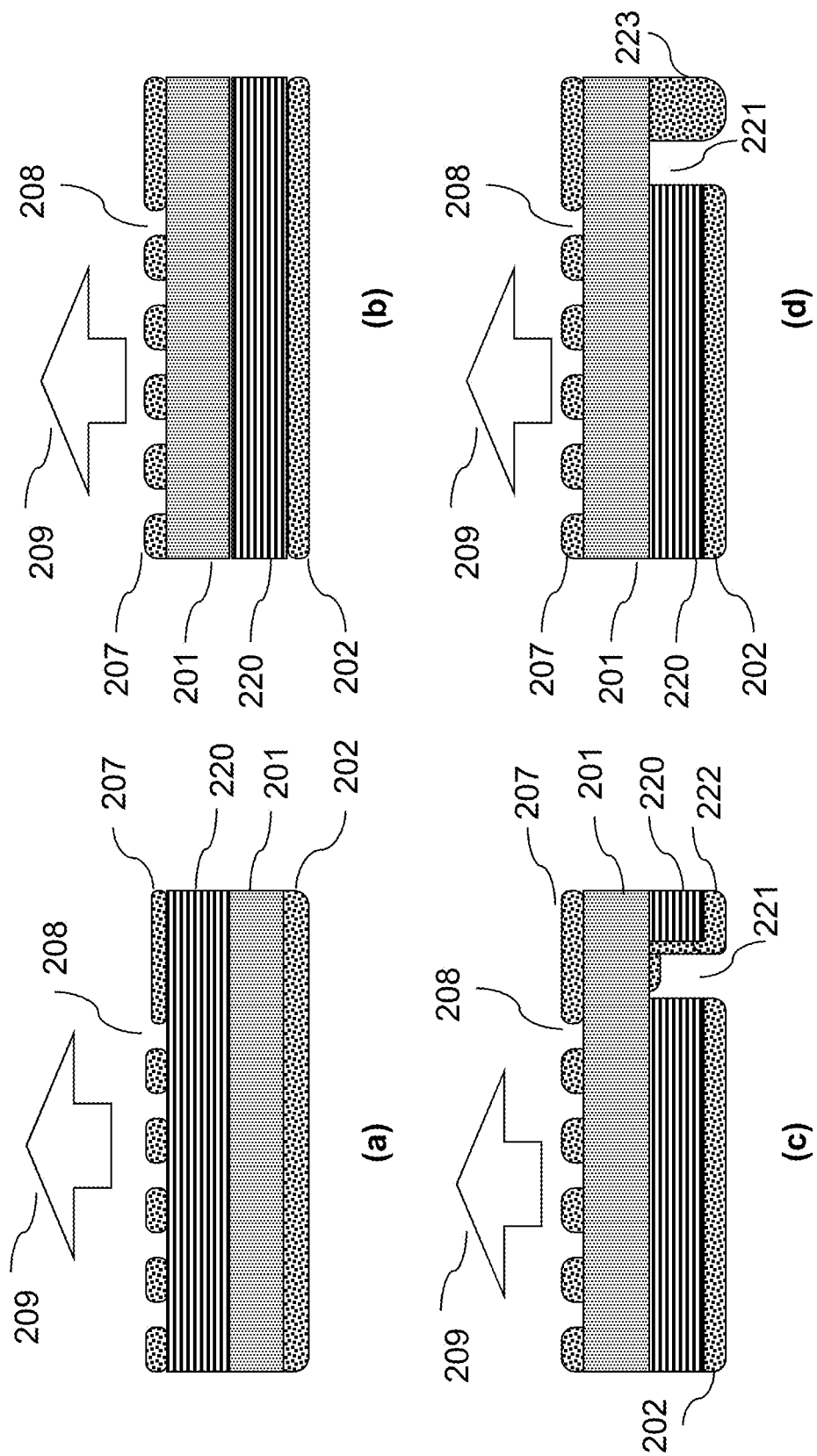
FIG. 2 is a schematic representation of a VCSEL array chip constructed on a common substrate having surface mountable metal contacts configured having respectively, a) and b) front and back contacts located on opposite surfaces and, c) and d) front and back contacts located on same surface.
Figure 3:
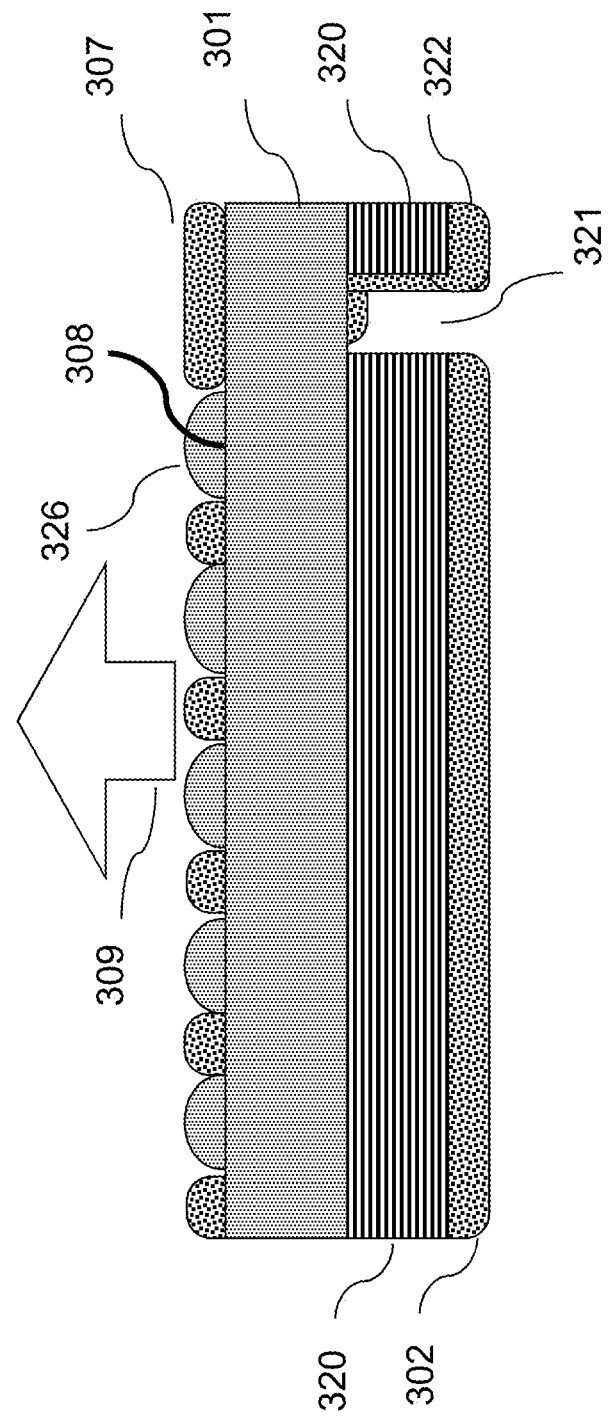
FIG. 3 is a schematic representation of a VCSEL array chip including an integrated microlens array.

In one variant embodiment shown in FIG. 3, additional optical functionality is provided by integrally constructing optical components to a surface mountable VCSEL array chip substantially similar to the one described in reference with FIG. 2c. More specifically, in FIG. 3, a VCSEL array chip comprises an active layer 320 disposed on a substrate 301. Part of the active layer 320 is selectively removed to create a trench 321 to facilitate connecting the top electrical contact layer 307 to an additional metallization layer 322 on the non-emission side of the substrate.

A microlens array comprising of a plurality of microlenses 326 is constructed on the emission end of the array chip such that each microlens in the array matches a corresponding window 308 (only one microlens and window is labeled for clarity) on the emission end. The microlens array may be constructed by selectively etching the substrate or by a post processing step. Different options available for post processing steps are well known in the art and will not be described. The height and curvature of the microlenes may be predetermined to provide a desired functionality for example, beam shaping by focusing or collimating the emission from each VCSEL in the array chip. It is also possible to construct different microlenses having different optical properties in different sections of the array chip.

One advantage of the surface mountable array chip constructed according to this invention is that the manufacturing process is simplified by reducing or eliminating complex alignment steps currently used for creating via holes through the substrate. The invention also provides a means to eliminate wire or ribbon bonding of the top (emission side) contact to a connector pad on the bottom (non-emission) side of the array chip. It should be noted that the applicants in a co-authored and co-owned prior U.S. patent application Ser. No. 13/337,098 by Seurin et al., filed on Dec. 24, 2011, described a surface mountable VCSEL array module where the contact from the top emission side of the VCSEL array is connected to a contact pad on a thermal submount on the non-emission side using a wire or ribbon bonding. Those skilled in the art will be able to recognize that the wire or ribbon bonded contacts are often the cause of device failure and also increase costs. The surface mountable array module described in this invention substantially reduces that risk by using only co-planar contacts.

VCSEL Array Module

Figure 4:
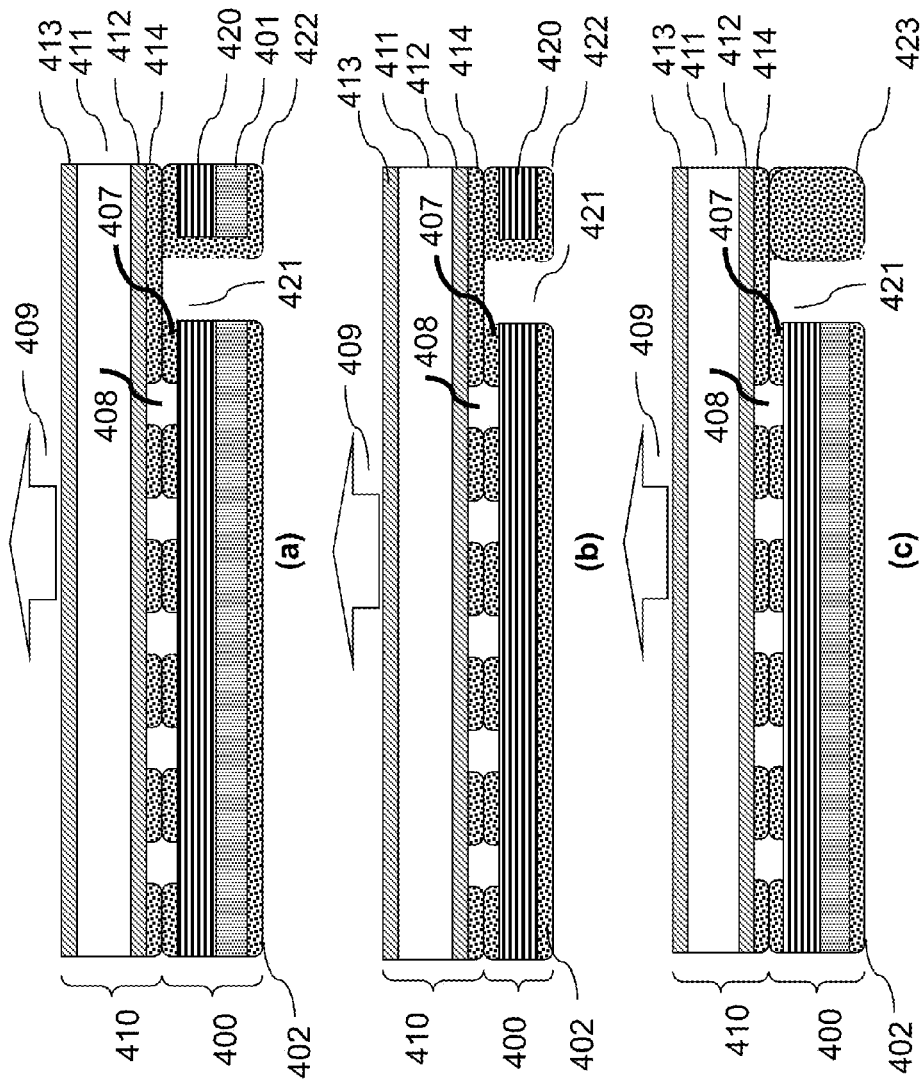
FIG. 4 is a schematic representation of a surface mountable VCSEL array module, a) with the substrate, b) without the substrate, and c) with a gold bump contact, respectively.

In one embodiment of the invention, surface mountable array chips described in the previous section are used to construct VCSEL array optical module (array module hereinafter). FIG. 4 shows an optical module constructed using a top emitting array chip similar to the one shown in FIG. 2a. The elements that are identical in different embodiments shown in FIGS. 4a, 4b and 4c are labeled with the same reference numerals. Referring now to array modules shown in FIGS. 4a, 4b, and 4c, section 400 collectively represents an array chip substantially similar to the one shown in FIG. 2a.

More specifically, the array chip shown in FIG. 4a comprises an active layer 420 disposed on a substrate 401. The array chip configured in the top emission mode includes a plurality of emission windows 408 (only one labeled) opened on a continuous metallization layer leaving the surrounding contiguous areas as metal pads 407 (only one pad labeled) for making electrical contacts on the emission side. The contiguous metal pads form a first terminal of the array module. A second section 410 of the module comprises a transparent carrier substrate 411 (carrier substrate hereinafter). The bottom and top surfaces of the carrier substrate are coated with antireflection layers 412 and 413, respectively. A continuous metallization layer 414 is disposed over one of the antireflection layers 412 (in this example). The metallization layer may be selectively deposited using a mask, or selectively removed, to open windows on the metallization layer, while the remaining contiguous metallization layer around the windows form metal pads for making electrical connections and bonding. The windows on the array chip and the carrier substrate may be created using the same mask set, such that the windows and the surrounding pads in the two sections align.

The carrier substrate 410 is flipped and bonded to the array chip at the metal pads by soldering, for example. However, other methods for bonding such as capillary bonding may also be used. The windows and the surrounding pads in the two sections align upon bonding the two sections. A portion of the active layer and the substrate is selectively removed to create a window or a trench 421 for connecting the top electrical contact of the array chip to a contact pad on the non-emission side. In an alternative embodiment shown in FIG. 4b, after bonding the two sections, the substrate 401 is thinned, or removed entirely (in this specific example) for more efficient heat dissipation from the VCSEL array.

A continuous metallization layer 402 is deposited on the bottom non-emission surface, such that part of the window 421 is without any metallization. An additional metallization layer is deposited to create a contact pad 422 for providing an electrical contact from top metal pads 407 to the non-emission side (proximal to the substrate in FIG. 4a) of the array chip, thereby forming a first and a second terminal of the array module via the carrier substrate bridge 414 in the metallization layer. In a different embodiment shown in FIG. 4c, a portion of the active layer 420 is selectively removed to electrochemically plate a gold bump 423 on the non-emission side leaving a gap 421 between the active layer and the gold bump, substantially similar to the one described in reference with FIG. 2d. The thickness of the gold bump is substantially equal to the thickness of the active layer. In the configurations shown in FIGS. 4a, 4b and 4c the first and second electrical contacts for the array are in a planar form and located on the non-emission surface. Light from the array module 409 is emitted through the carrier substrate 410 which also seals and protects the VCSEL devices located on the array chip.

Figure 5:
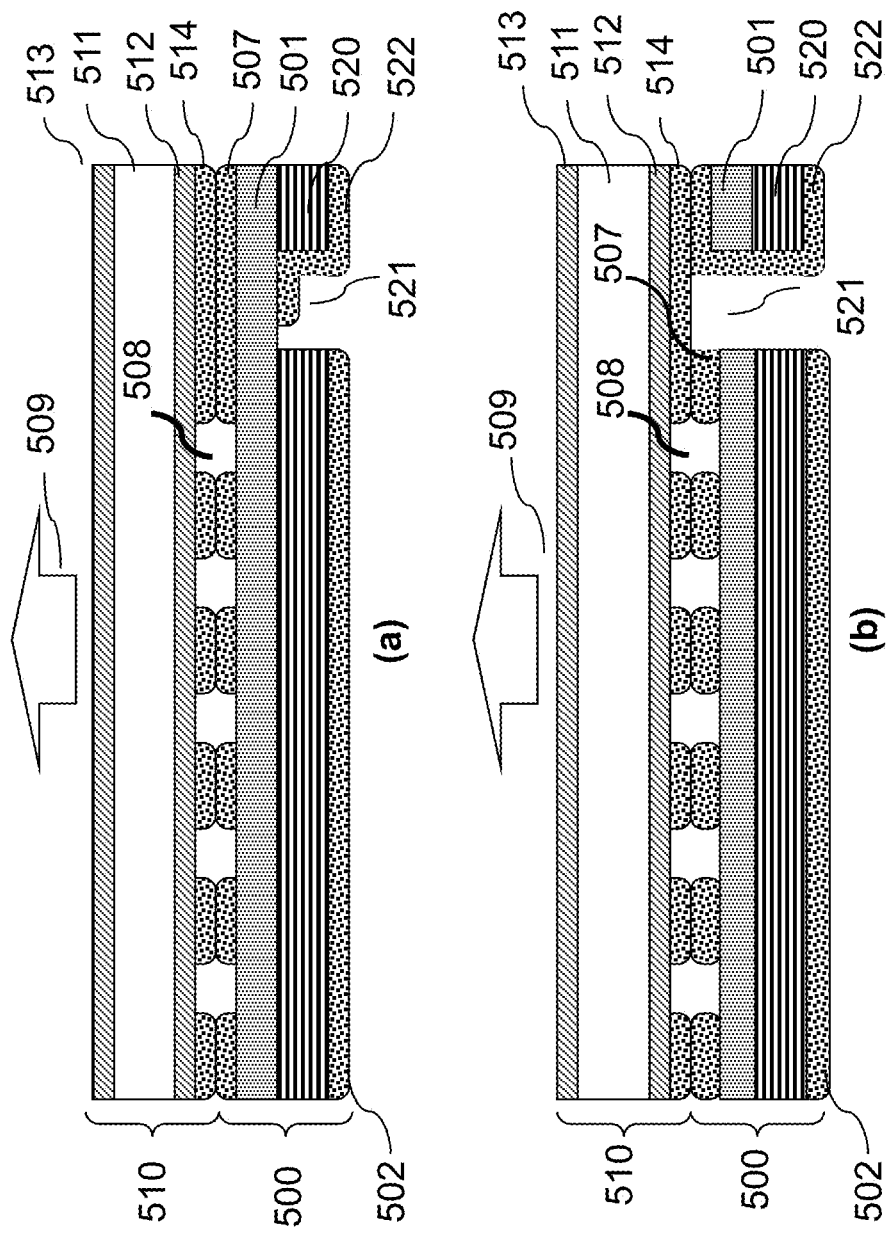
FIG. 5 is a schematic representation of a surface mountable VCSEL array module: a) without a substrate bridge, and b) with a substrate bridge, respectively.
Figure 6:
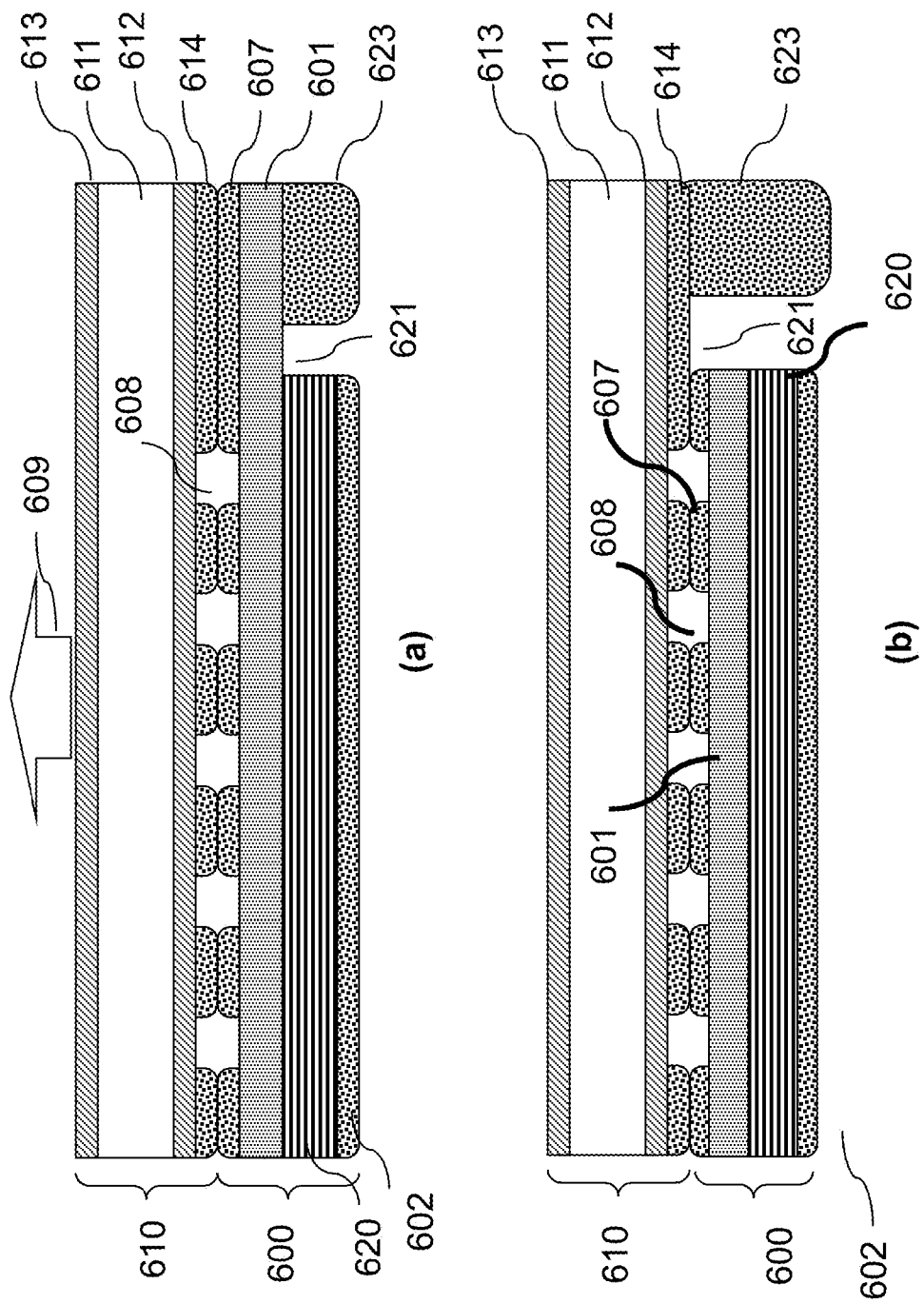
FIG. 6 is a schematic representation of a surface mountable VCSEL array module with surface mountable gold bump contact a) without a substrate bridge, and b) with a substrate bridge, respectively.

FIGS. 5 and 6 show exemplary array modules constructed from array chips shown in FIGS. 2c and 2d, respectively. Reference numerals in FIGS. 5 and 6 follow the same convention as the reference numerals in FIG. 4. Referring now simultaneously to FIGS. 2, 4, 5 and 6, the array module shown in FIG. 5a has an array chip section 500 bonded to a carrier substrate section 510 that are substantially similar to the ones described earlier in reference with FIGS. 4a and 4b. The reference numerals 511, 512, 513 and 514 represent elements that are substantially similar to the elements 411, 412, 413 and 414, respectively, described earlier in reference with FIG. 4. That description will not be repeated for brevity.

The array chip in the embodiment shown in FIGS. 5a and 5b is configured in bottom emission mode and is substantially similar to the one described in reference with FIG. 2c. The active layer 520 is selectively removed to create a trench 521 in order to deposit an additional metallization layer 522 to make an electrical connection from the top contact layer 507 on the emission surface to the non-emission side surface of the device, such that the two planar terminals (522 and 502) of the array chip are located on the non-emission side of the substrate in planar form.

The embodiment shown in FIG. 5b is substantially similar to the one described in reference with FIG. 5a except for the structure of the trench 521. In this example, the trench is extended all way to the carrier substrate by selectively removing the active layer and the substrate. The additional metallization layer 522 connects the top metallization layer 507 of the array chip using the bridge, created by the metallization layer 514. The metallization layers 522 and 502 form the two planar contacts for the array terminals located on the same side of the substrate. In the embodiments shown in FIG. 5, the light from the array module is emitted in a vertical direction (relative to the page) shown with the arrow 509.

Referring now simultaneously to FIGS. 6a and 2d, the embodiment shown in FIG. 6a comprises an array chip section 600 bonded to a carrier substrate section 610. The carrier substrate section 610 is substantially similar to the ones described in reference with FIGS. 4 and 5 and that description will not be repeated. The elements shown by the reference numerals 611, 612, 613 and 614 are described earlier in reference with similar elements 411, 412, 413 and 414 shown in FIG. 4. The array chip is configured in the bottom emission mode substantially similar to the one shown in FIG. 2d.

More specifically, a portion of the active layer 620 is selectively removed from the substrate 601. On the exposed section of the substrate, an electrical contact is made by selectively electroplating a metal layer 623 leaving a gap 621 between the active layer and the electroplated region. The electroplated contact layer is located on the same side as the contact layer 602 and the thickness of the plated region is substantially equal to the thickness of the active layer. The plated region is electrically connected to the top contact layer 607 via the substrate. The electroplated metal layer 623 and the non-emission side contact layer 602 form the two terminals of the array module. Since in this case the substrate 601 can be conducting and carry the electrical current, the metal layers 614 and 607 may not be necessary, and the substrate 601 may be bonded directly to carrier substrate 610, using well known techniques such as capillary bonding.

The embodiment shown in FIG. 6b is substantially similar to the embodiment shown in FIG. 6a and comprises two sections 600 and 610, representing an array chip and a carrier substrate section, respectively. The carrier substrate section 610 includes elements (611-614) that are substantially similar to the elements (611-614) described in reference with FIG. 6a. In addition, the carrier substrate includes an electroplated region 623 located on a part of the metallization layer 614.

The carrier substrate section is bonded to the array chip 610 by aligning the metal pads 607 with a corresponding metal pad 614 and pressing them together and in some cases fusing them with heat, such that the windows 608 align with the windows in the substrate. Soldering techniques can be also used to attach 607 to 614. The metal pads 607 are electrically connected with the electroplated layer via the metal bridge of the metallization layer 614 on the carrier substrate. The metallization layer 602 and 623 form the two terminals of the array module located on the non-emission side of the substrate. The light emission shown by the arrow 609 is in the vertical direction (with reference to the page) from the top surface of the array chip substrate.

There are several advantages of constructing the surface mountable array modules according to this invention. One advantage is that the top contact on the emission surface is connected to the non-emission side of the module using planar contacts (without wire or ribbon bonding), which reduces the risk of failure considerably. The invention also eliminates the need for the complex alignment steps used in conventional surface mountable devices for the alignment of via holes through the substrate. Furthermore, the array chip is bonded to the carrier substrate using a metal-metal solder or fusion bonding between the pads which is more robust as compared to epoxy bonding often used for this purpose in prior art devices. Other bonding methods such as capillary bonding may also be used. In addition, different sections may be pre-fabricated separately and assembled in a modular fashion in a relatively shorter time, thereby improving throughput in a manufacturing environment and reducing cost. It should be noted that the principles of the invention is described using planar contacts, the same principles may be applied to other surface mountable VCSEL arrays using wire or ribbon bonding. However, those skilled in the art would be able to appreciate the merits of the planar contact options over other connector options described in the co-authored and co-owned pending U.S. patent application Ser. No. 13/337,098 by Seurin et al., filed on Dec. 24, 2011

Figure 7:
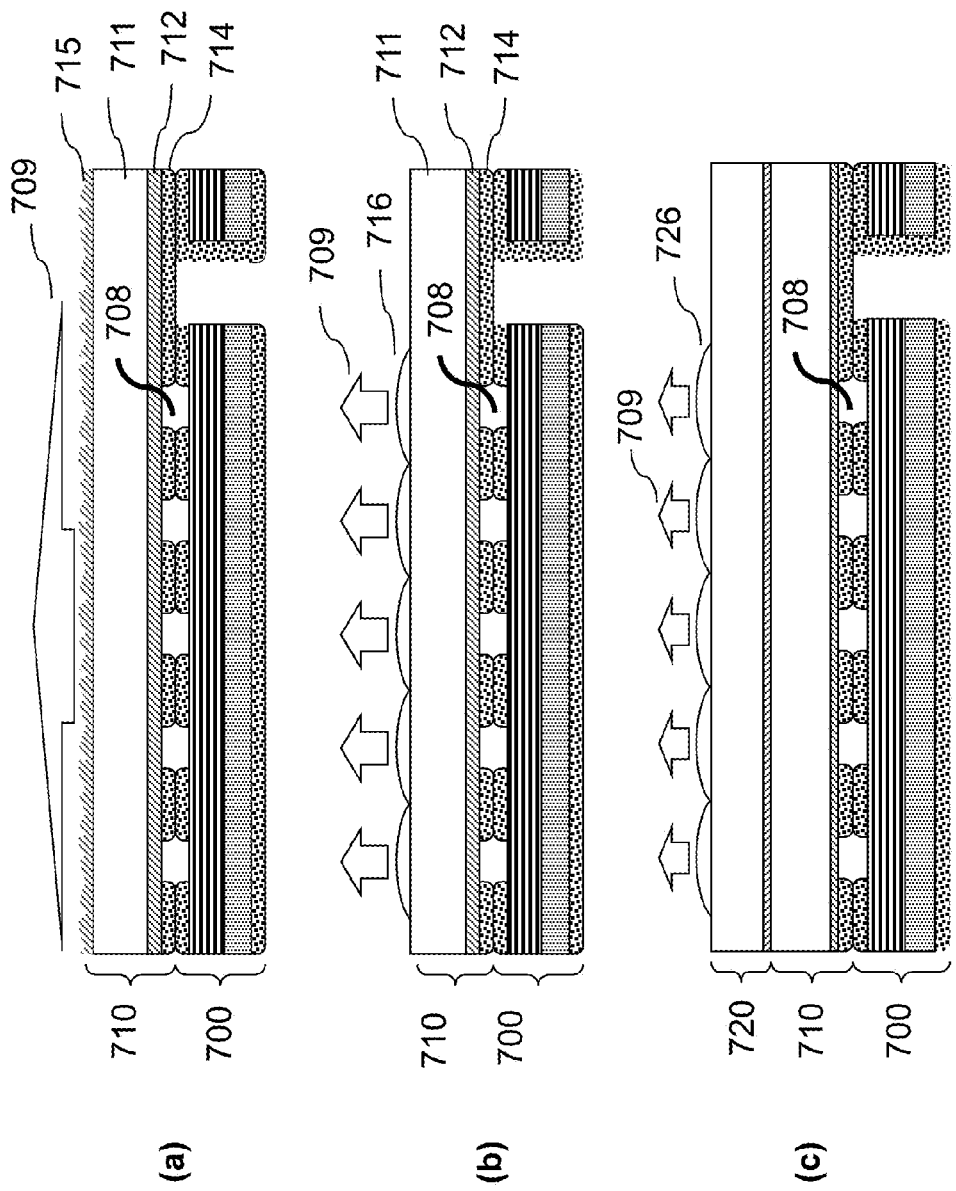
FIGS. 7a, 7b and 7c represent VCSEL array modules configured with additional optical components for various beam shaping functions.

Emission from a VCSEL device is generally (although not always) a Gaussian like narrow beam in the sense that most of the beam's energy is located at the center of its transverse distribution. In many applications and in particular, in an illuminator application it is often desired to shape the output beam of a VCSEL device. The applicants in the co-authored and co-owned pending U.S. patent application Ser. No. 13/337,098 by Seurin et al., filed on Dec. 24, 2011 disclosed different methods to shape VCSEL output beams. That description is being incorporated by reference in its entirety. FIG. 7 shows a few exemplary embodiments of beam shaping methods that may be used in conjunction with the array modules described in reference with FIGS. 4, 5 and 6. Each element shown in embodiments 7a, 7b and 7c are labeled using substantially similar reference numerals as in FIGS. 4, 5 and 6. The elements represented by similar reference numerals will therefore not be described in detail again.

More specifically, the embodiment shown in FIG. 7a comprises an array chip section 700 and carrier substrate section 710. The array chip section is substantially similar to the one described in reference with FIG. 4a. That description will not be repeated. The carrier substrate 710 comprises a substrate 711 having one side coated with an antireflection layer 712. Furthermore, a metallization layer 714 having windows aligned with the chip array windows 708 is disposed on the antireflection layer proximal to the array chip. The remaining contiguous metallization layer surrounding the windows forming metal pads are used to bond the sections 710 and 700. Unlike the optical array described in reference with FIG. 4a, the top emission surface of the substrate section is constructed to have an optical element for beam shaping, for example a diffuser 715 instead of a second antireflection layer (414 in FIG. 4a). As a result, the light 709 emitted out of the array module is diffused.

In some other applications, in addition to reducing speckle for example, the diffuser is also used to increase the divergence angle of the array to a predetermined number. The embodiment shown in FIG. 7a is particularly suitable for an application where a uniform diffused illumination pattern is preferred for example, security illumination for perimeter monitoring, where cameras of certain field of view are used with laser illuminators illuminating the same field of view, or illumination for 3D imaging or gesture recognition, where illumination of a rectangular field of view of certain divergence angle, matching the camera divergence is required. In addition, 715 may be a diffractive or holographic optical element, for example.

Although the divergence angle of a VCSEL emission is quite small (~10-15°, output from a VCSEL still spreads over a large distance away from the emission surface. As a consequence, the light emitted from the module may not be focused uniformly over a large surface area at a large distance from the illumination surface. In another embodiment of the invention shown in FIG. 7b having an array chip 700 and a transparent carrier substrate section 711, the top emission surface of the carrier substrate section includes an additional optical element, for example an array of microlenses 716, each microlens in the array is aligned with a corresponding emission window 708 on the array chip. One advantage of having individual microlenses is to collimate and reduce the angle of the diverging beam, for example.

The height at which microlenses are disposed above the array chip may be pre-determined and precisely controlled by the thickness of the carrier substrate 711 for example, such that individual emissions from adjacent VCSELs each collimated using a corresponding microlens, fill up the dark space between the adjacent emissions. As a result, overall emission from the entire array module is distributed uniformly even at considerably large distance away from the array module. This embodiment may be particularly suitable for an application where an array module is configured to pump a solid state gain medium as described earlier in the co-authored (by some of the applicants) and co-owned U.S. patent application Ser. No. 13/369,581 filed on Feb. 9, 2012, by van Leeuwen et al. now issued as the U.S. Pat. No. 8,576,885 on Nov. 5, 2013.

In an alternative embodiment shown in FIG. 7c, which is otherwise identical to the array module described in reference with FIG. 4a, an additional optical element including a carrier substrate 720 having an array of micro-lenses 726 is disposed above the carrier substrate 711 and the array module 700. The microlens array is positioned at a predetermined height where each microlens in the array is aligned with an emission window 708. One advantage of this embodiment is that a prefabricated microlens array may be added or bonded to an existing array module similar to that shown in FIG. 4a, for example.

In general, a carrier substrate may include but is not limited to, glass, sapphire, diamond, etc. Although the principles of this embodiment is described in reference with a top emitting array module, other types of array modules described in other embodiments are not precluded. Furthermore, the basic idea of having additional optical elements is conveyed using a few representative examples. It should not be construed that other types of optical elements suitable for beam shaping are precluded.

In an alternative embodiment, larger size array modules are produced by configuring a plurality of array chips electrically connected in predetermined arrangement for different applications, as shown in FIGS. 8a and 8b. The plurality of array chips may be connected in a wafer level processing, as well as by assembling them on a common transparent carrier substrate. Although FIGS. 8a and 8b show a plurality of array chips, for clarity of representation, only one set of elements are labeled. Furthermore, identical elements or elements with similar functionalities in FIGS. 8a and 8b are labeled with same reference numerals unless stated otherwise. To keep the description short, identical elements in FIGS. 8a and 8b will be described together and only the differences between the two embodiments will be described separately.

Figure 8:
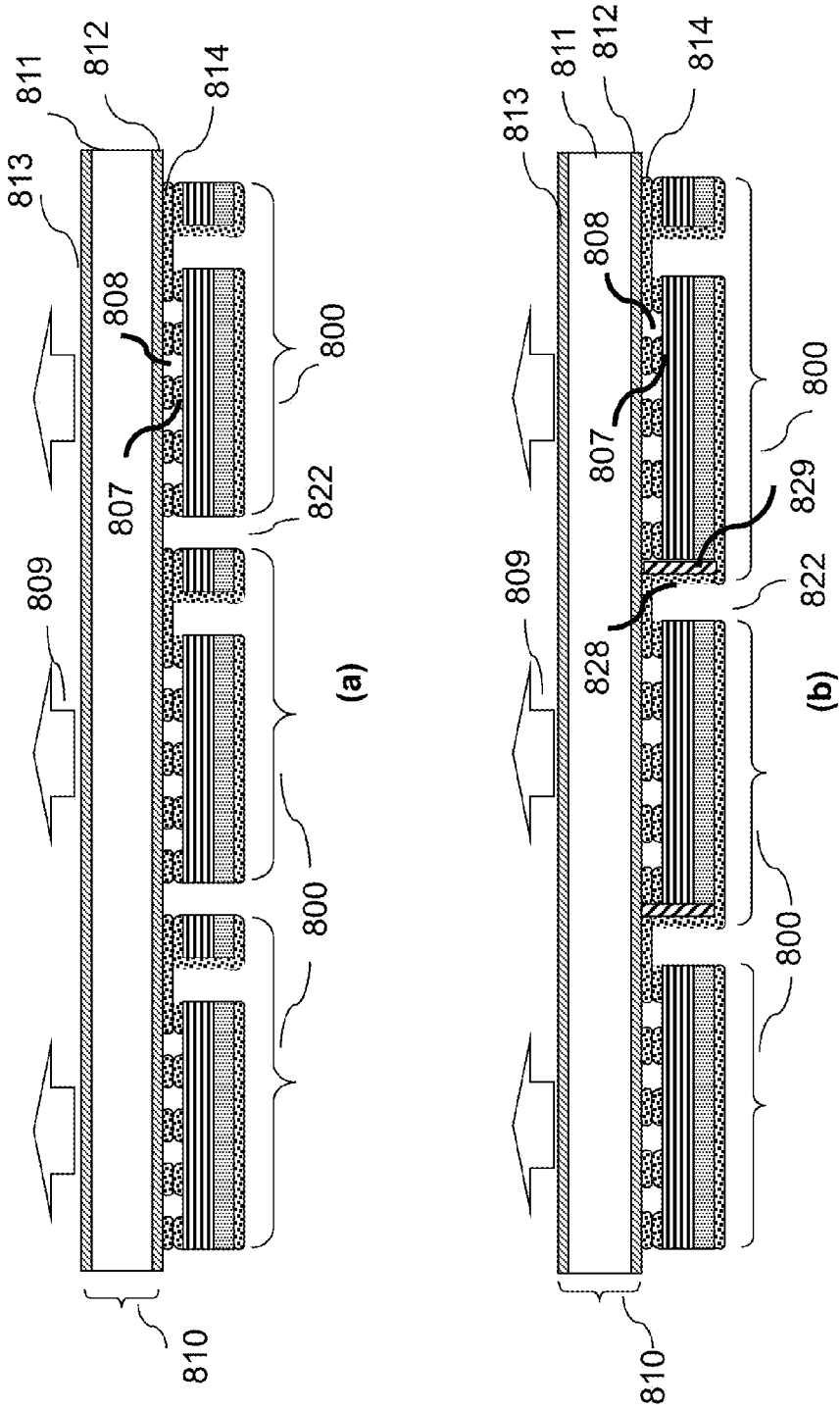
FIG. 8 is a schematic representation of an array of VCSEL array chips bonded to a transparent carrier substrate respectively, in a) electrically isolated configuration and b) electrically connected together in a series configuration.

More specifically, the array modules shown in FIGS. 8a and 8b include a plurality of surface mountable array chips 800 substantially similar to the ones described in reference with FIGS. 2a, 2b, 2c and 2d. The surface mountable array chips will not be described in detail. The array chips may be electrically connected at the wafer level (or assembled) in a predetermined pattern on a common transparent carrier substrate 810. Referring simultaneously to FIGS. 8 and 4, the carrier substrate is substantially similar to the section 410 described with reference to FIG. 4a, for example. In particular, the section 810 comprises a transparent carrier substrate with top and bottom surfaces coated with antireflection layers 812 and 813, respectively.

A metallization layer 814 is disposed on the top antireflection layer 812. Windows are selectively created on the metallization layer to match corresponding emission windows 808 (only one labeled) of the array chip. The remaining parts of the metallization 814 layer surrounding the windows are used as bonding pads that match corresponding bonding pads 807 (only one labeled) on the array chip. Several options to create windows and the metal pads by selective etching or by selective deposition are well known in the art, and would work equally well.

The carrier substrate is designed to accommodate a plurality of array chips separated by a gap 822 (only one labeled) or a trench between adjacent array chips. The array chips may be electrically isolated from one another, electrically connected in parallel, or may be connected in series using a metal track 828 over an isolating material 829 for example, such that the bottom terminal of one array chip is connected in series with the top terminal of an adjacent array chip. The metallization pattern 814 on the substrate may be designed to connect the array chips in a desired configuration. The isolating material 829 may include but is not limited to, a photoresist, or a polymer for example, as is well known in the art.

Although the exemplary array module including a plurality of array chips is described in reference with a top emission type surface mountable array chip, the principles may be extended to bottom emission chips as well. Furthermore, the carrier substrate 810 in this example is shown as a clear window, it may include other optical elements shown in FIG. 7, such as a diffuser window, microlens array etc. Those skilled in the art will be able to appreciate that every aspect of the construction of array module including optical elements may be implemented in a modular fashion, thereby providing significant flexibility in design choices, and easy expansion to high power modules.

One important aspect of this invention is that an array module as shown in FIG. 8 may entirely be constructed in a wafer level processing in a modular fashion. In one preferred embodiment of the invention, a plurality of array modules each including one or more array chips connected in a desired configuration, are first fabricated monolithically on a single wafer. Referring now to FIG. 1 and FIG. 8 simultaneously, a wafer is first processed to construct at least one reflector and the light emitting region on the entire wafer in an epitaxial growth step. The second reflector may be constructed in one or two steps as per the design requirement for example, if the second reflector is a single type of reflector (FIGS. 1a and 1b) or a hybrid reflector (FIG. 1c). Array chips and interconnection between the array chips in a desired configuration namely, series or parallel connected array chips, are defined using selective metallization or selective etching, to monolithically construct the emission side contact in this particular example. The processed wafer may then be bonded to a transparent carrier substrate that is prepared separately.

The carrier substrate is processed separately to construct the windows, trenches and bonding pads that would substantially match corresponding elements on the array module wafer. The carrier substrate is bonded to the entire array module wafer using metal-metal bonding, capillary bonding, solder pad bonding or any other bonding method using heat, pressure or a combination thereof, that are well known in the art. In another variation, the array module wafer bonded to the carrier substrate, may further be processed for example, the substrate may be thinned significantly, or removed completely to prevent absorption of emitted light in the substrate of for providing better thermal management. The non-emission side contact may be made before or after the bonding of the array module with the carrier substrate. It may be appreciated that other than the exemplary sequence described here, many processing options that are well known in the art are also available to practice the invention and are not precluded within the broad framework of this invention.

Advantageously, the principles described here offer a multitude of design choices and expansion options for constructing or expanding a VCSEL array illuminator in a modular fashion. For example, in one variant embodiment, the VCSEL devices in an array chip may be arranged in any arbitrary array pattern instead of a regular array pattern (e.g., as shown in FIG. 1d) to conform to any shape and/or size of the area to be illuminated. The array chips may be electrically connected in many different ways (series or parallel) to expand the size of the array module, or to construct array modules to illuminate any arbitrary shaped area, for example. Furthermore, optional optical components including but not limited to, beam shaping components, such as diffuser, microlens or microlens arrays may be further bonded to the carrier substrate as has been described in reference with FIG. 7. The bonded wafers may be diced to produce smaller array modules for applications as individual modules or may be assembled on a common thermal substrate or a heat dissipation device to produce larger size array modules. The array modules described in reference with FIGS. 4, 5, 6 and 7 are particularly suited for a high throughput manufacturing environment, thereby substantially reducing the cost of high quality illuminator modules.

As an alternative, array chips of different size and shapes may be first separated from a processed wafer and each array chip may be tiled together to construct an array module of a predetermined shape and/or size and connected in a prescribed or required electrical configuration for obtaining a desired output power and shape for illuminating a surface/object, depending upon the application. A common transparent carrier substrate is then bonded to the entire tiled arrangement of array chips in one step. One advantage of this approach is to be able to construct a module from pre-fabricated array chips. Those skilled in the art will be able to appreciate a wide range of design choices including those for power and thermal management, are available within the broad framework of this invention.

VCSEL Array Illuminator Module

Surface mountable VCSEL array chips or array modules as described in the previous sections, may be assembled in many different ways to construct an illuminator module. Different embodiments of exemplary illuminator modules are shown in FIGS. 9a, 9b and 9c. Elements that are substantially similar or have substantially similar function are labeled using same reference numerals. For convenience, a general description is presented with reference to the embodiment shown in FIG. 9a; however, it is equally pertinent to embodiments shown in FIGS. 9b and 9c as well. In particular, the illuminator module shown in FIG. 9a comprises an array module 902 having one or more surface mountable array chip described earlier with reference to FIGS. 2, 4, 5, 6 and 7. That description will not be repeated.

The surface mountable array module may be bonded to a thermal submount 901 for efficient heat dissipation. Different types of thermal submount described in the pending U.S. patent application Ser. No. 13/337,098 by Seurin et al., filed on Dec. 24, 2011, will be equally effective for this purpose. The array module terminals 910 and 920 are bonded to the wrap around contact pads 903 and 904, respectively, located on the top and bottom surfaces of the thermal submount 901.

In an alternative embodiment shown in FIG. 9b, the contact pads 903 and 904 on the thermal submount top surface are electrically connected to corresponding bottom contact pads using via holes 905 (only a few labeled) located between the top and bottom surfaces of the thermal submount 901. The array modules may bonded using solder, heat, pressure or a combination thereof, which are well known to be more reliable and cost effective as compared to wire or ribbon bonded contacts described in the pending U.S. patent application Ser. No. 13/337,098 by Seurin et al., filed on Dec. 24, 2011.

The array module 902 may be further encapsulated using a transparent polymer for example, to protect the emission surface. While polymer encapsulation is well known in the art, in the illuminator modules shown in FIGS. 9a and 9b, the transparent polymer is selected and applied so as to provide additional optical functions. In the exemplary embodiment shown in FIG. 9, the encapsulation 912 is designed to function as a lens. The lens radius and the height above the array module are predetermined, such that the light 909 is emitted from the encapsulated illuminator module in a pattern selected to suit a particular application. For example, to obtain a uniform illumination pattern at a relatively large distance away from the illuminator module, the polymer encapsulation lens is designed to function as a collimator, and so forth.

Figure 9:
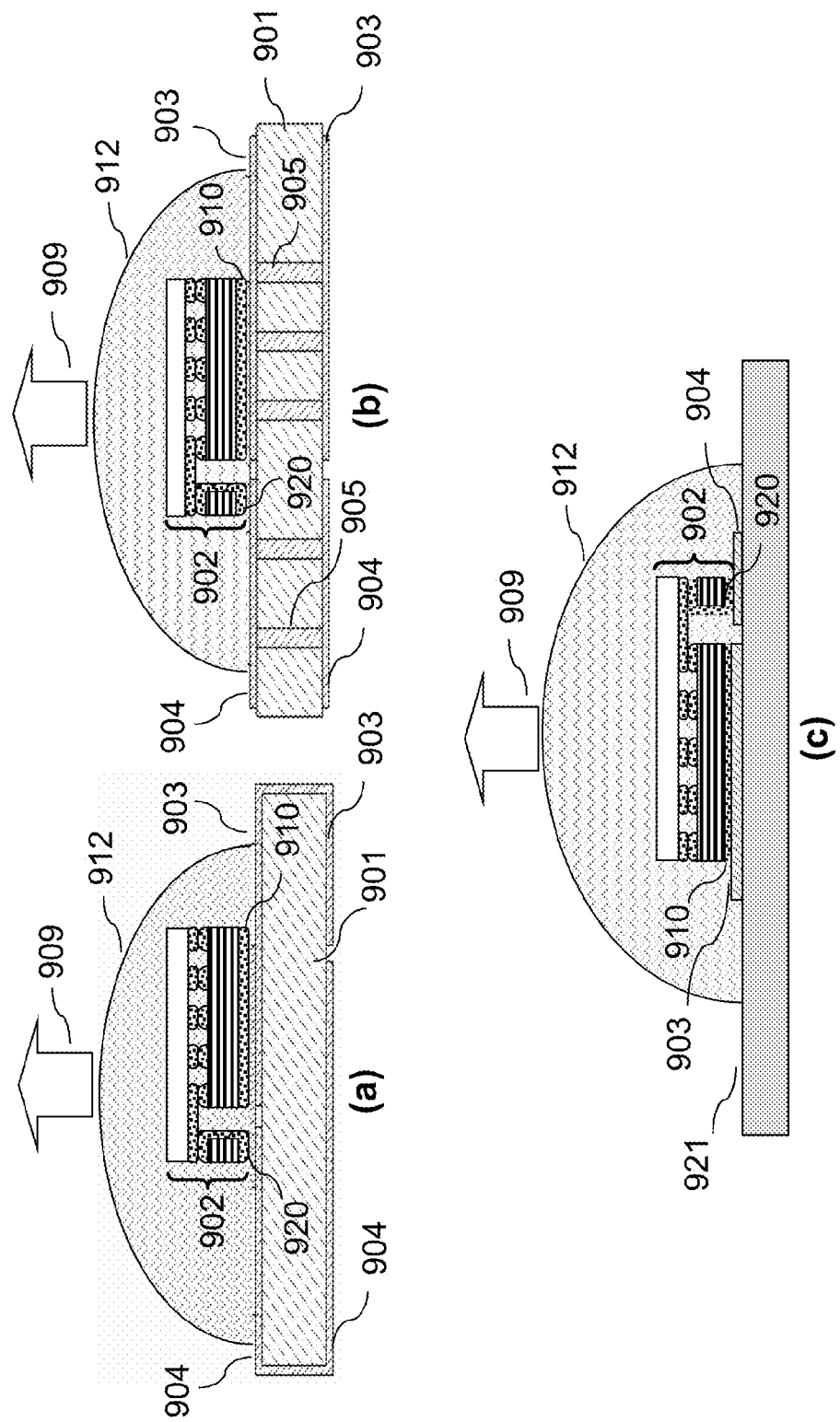
FIG. 9 is a schematic representation of surface mounted VCSEL array optical modules encapsulated on a) a wrap around thermal submount, b) a low inductance via hole submount, and c) on a printed circuit board co-located with driver electronics (not shown), respectively.

In a variant embodiment shown in FIG. 9c, an array module 902 is surface mounted to electrical pads 903 and 904 on a Printed Circuit Board (PCB) 921 at the respective terminals 910 and 920. The PCB 921 includes electronic circuits (not visible in this view) to provide drive current and/or control functions to the array module. In this embodiment, the transparent polymer encapsulation is provided on the PCB surface to protect the array module and the associated electronic circuits. The embodiments shown in FIG. 9 are particularly suitable as low power stand-alone illuminators for illuminating small surface area. Small low power portable illuminator module that does not require additional heat dissipation arrangement, may be designed to operate using batteries for example.

For obtaining higher power illuminator or to illuminate a large surface area, array modules are constructed by tiling multiple arrays on a common transparent carrier substrate, similar to the one described with reference to FIG. 8. Such an array module may be constructed either by tiling the required number of array chips monolithically in a wafer level processing followed by bonding the monolithically integrated array module to the carrier substrate, or by tiling individual modules on a common carrier substrate. One example of an array module using four array chips is shown in FIG. 10.

Figure 10:
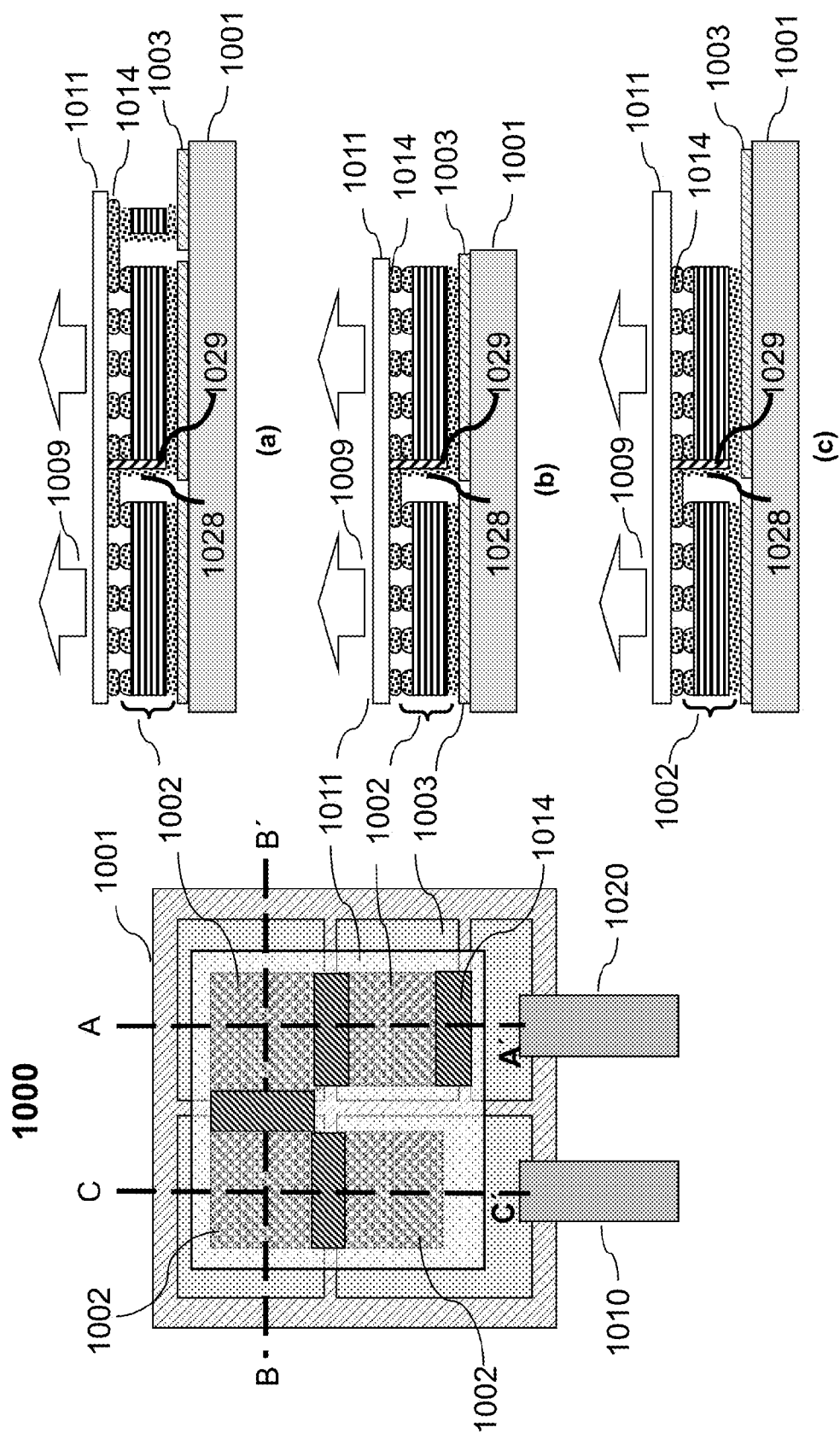
FIG. 10 represents an optical illuminator module comprising four VCSEL array module chips showing respectively, a) top planar view, b), c) and d) cross section views through different projections of the illuminator module.

FIG. 10 shows a schematic planar view 1000 on the left side of the page, and three different cross section views 10a, 10b and 10c, on the right hand side of the page, projected respectively, at lines AA', BB', and CC' shown in the planar view (each rotated at 90° from the previous cross section view). Elements that are substantially similar or provide substantially similar functions are labeled using same reference numeral for ease of description and to avoid repetition.

More specifically, the illuminator module shown in FIG. 10 comprises four array chips 1002, arranged monolithically in a 2×2 array pattern on a common substrate (not shown). In this exemplary module, light is emitted in a square area which is particularly suitable for lighting a screen, readout, or a back plane, for example. On the emission side, the monolithic 2×2 array is bonded to the carrier substrate 1011. The carrier substrate includes a metallization layer having windows created on the metallization layer to match with the windows on the array chip. For bonding to the array chip, the carrier substrate is flipped to match metal contacts on the substrate to the metal pads on the array chips. In this particular example the four array chips are electrically connected in series using connector bridges 1014 constructed on the carrier substrate 1011 and additional connectors 1028 supported on an insulator layer 1029 (not visible in the planar view) in the gap between adjacent array chips.

Individual contact pads 1003 are constructed for each array chip of the monolithic 2×2 array on the non-emission side. The contact pads may be arranged so that the array chips are connected in series. The contact pads 1003 are used to surface bond the 2×2 array on corresponding pads located on a common base 1001. The two terminals of the array module are accessed through the two metal strips 1010 and 1020, respectively (not visible in the cross section views). The common base may include but is not limited to, a thermal submout, a PCB including one or more electronic circuit(s) or a combination thereof. Additional heat dissipation devices may be used for air or liquid cooling of the array module. As mentioned earlier, any bonding method including but not limited to, solder, heat bonding, pressure bonding, capillary bonding or a combination thereof, may be used for different bonding steps.

One advantage of modularly constructing the array module according to this invention is that the array chips can be of any shape and/or can be tiled to suit any regular or arbitrary geometric shape conforming to the area or object to be illuminated. Another advantage of tiling of array chips results in obtaining higher output powers, or to cover larger illumination area in a modular fashion. Two exemplary arrangements of array modules configured in a 1×6 linear array and a 2×6 two-dimensional array, respectively, using square array chips to emit light in a rectangular area are shown in FIGS. 11a and 11b. A particular application of this configuration is in side pumping of a bar of a solid state gain medium, for example.

More specifically, square array chips 1102 are configured in a 1×6 linear array and a 2×6 two-dimensional array, respectively, using standard processing steps described in reference with FIG. 10. In FIGS. 11a and 11b elements that are substantially similar or provide substantially similar functionality, are labeled with same reference numeral for ease of description. A transparent carrier substrate 1111 including a metallization layer, having windows to match with the windows on the array chip, is bonded on the emission side of the array chips using metal contact pads 1114. The bonding may be achieved either by soldering heating, applying pressure, by capillary action, or a combination of techniques that are well known in the art. Advantageously, a large number of modules may be constructed monolithically on a single wafer, bonded to a common carrier substrate, and may be separated if needed, by dicing the finished modules.

The array chips include individual contact pads 1103 for surface mounting to a common base 1101. The common base may include but is not limited to, a thermal submout, a PCB including electronic circuits, etc. The array chips are electrically connected in series as has been described earlier in reference with FIG. 10 so as to operate them together using a drive current applied between the electrical connectors 1110 and 1120 connected respectively to two terminals of the array module. The two terminals of the array module are accessed through the two metal strips 1110 and 1120, respectively, for example to provide electrical connection to apply a drive current. The electrical connectors may be located at opposing ends of the module (FIG. 11a) or they may be located on the same side of the module (FIG. 11b).

In another embodiment of the invention, array chips are configured in a circular pattern as shown in FIGS. 12a and 12b. In one arrangement shown in FIG. 12a, an array module to emit light in a circular area is configured using four quarter circle array chips 1202 that are monolithically constructed on a common substrate. A transparent carrier substrate including electrical contact pads 1214 (only one labeled for clarity) is bonded to the array chips such that the array chips are electrically connected in a desired configuration, for example in series for this particular embodiment. The entire module is diced and bonded on the pads 1203.

In an alternative arrangement shown in FIG. 12b, an array module to emit light in a circular area is configured using a central circular array chip 1204 and concentric half rings (1202) that are connected in series on a carrier substrate 1211. The array chips are constructed monolithically and bonded to the carrier substrate 1211 that includes emission windows and metallization pads 1214 with appropriate geometry, to match the geometrical arrangement of the array chips. The array chips bonded to the carrier substrate is diced and assembled on the bonding pads 1203. The emission area is circular in the embodiments shown in FIGS. 12a and 12b, and is particularly suitable for end-pumping a solid state gain medium, for example.

Figure 11:
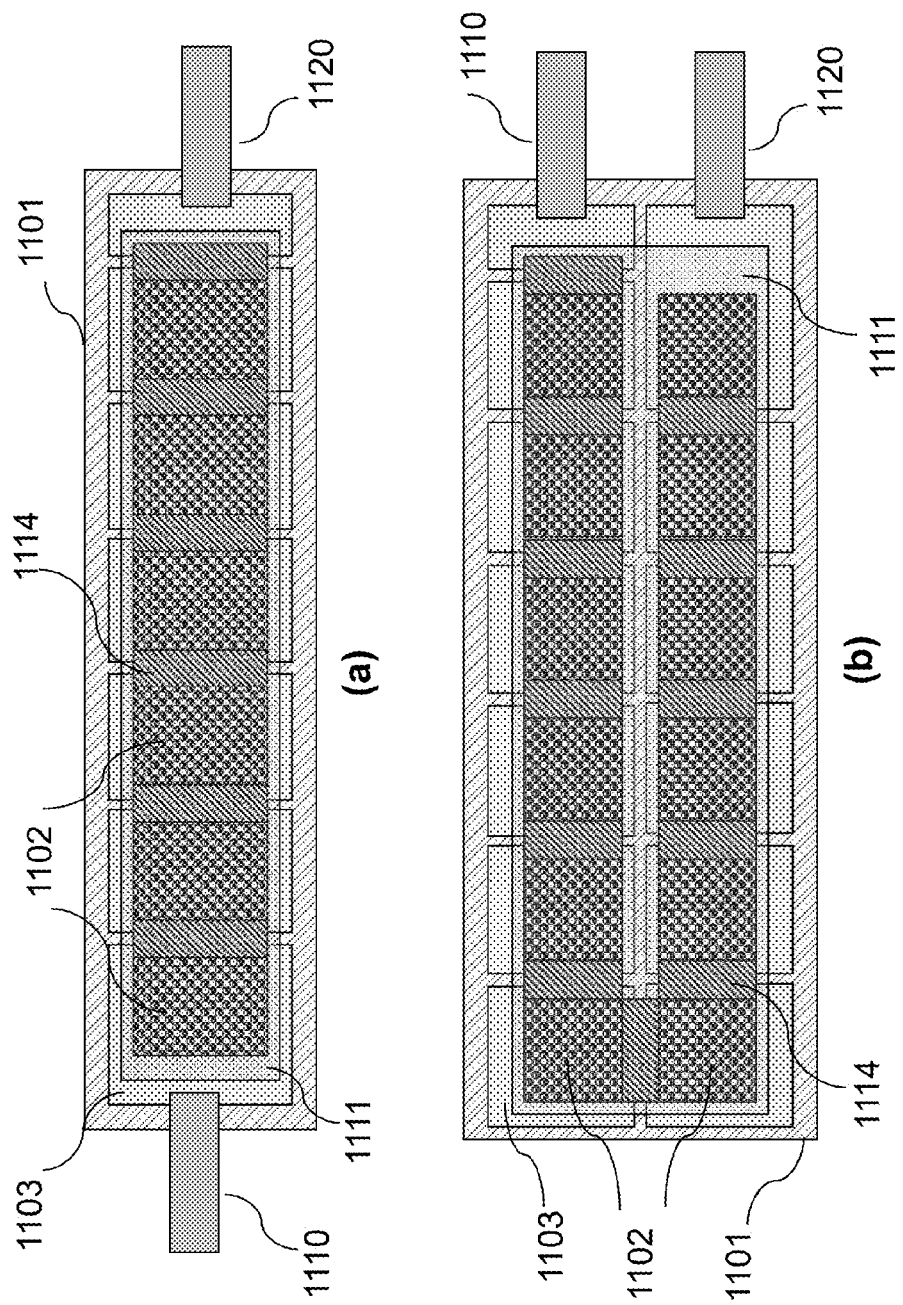
FIG. 11 is a schematic representation of VCSEL array module chips arranged respectively, in a) a linear array, and b) in a side-by-side linear array.
Figure 12:
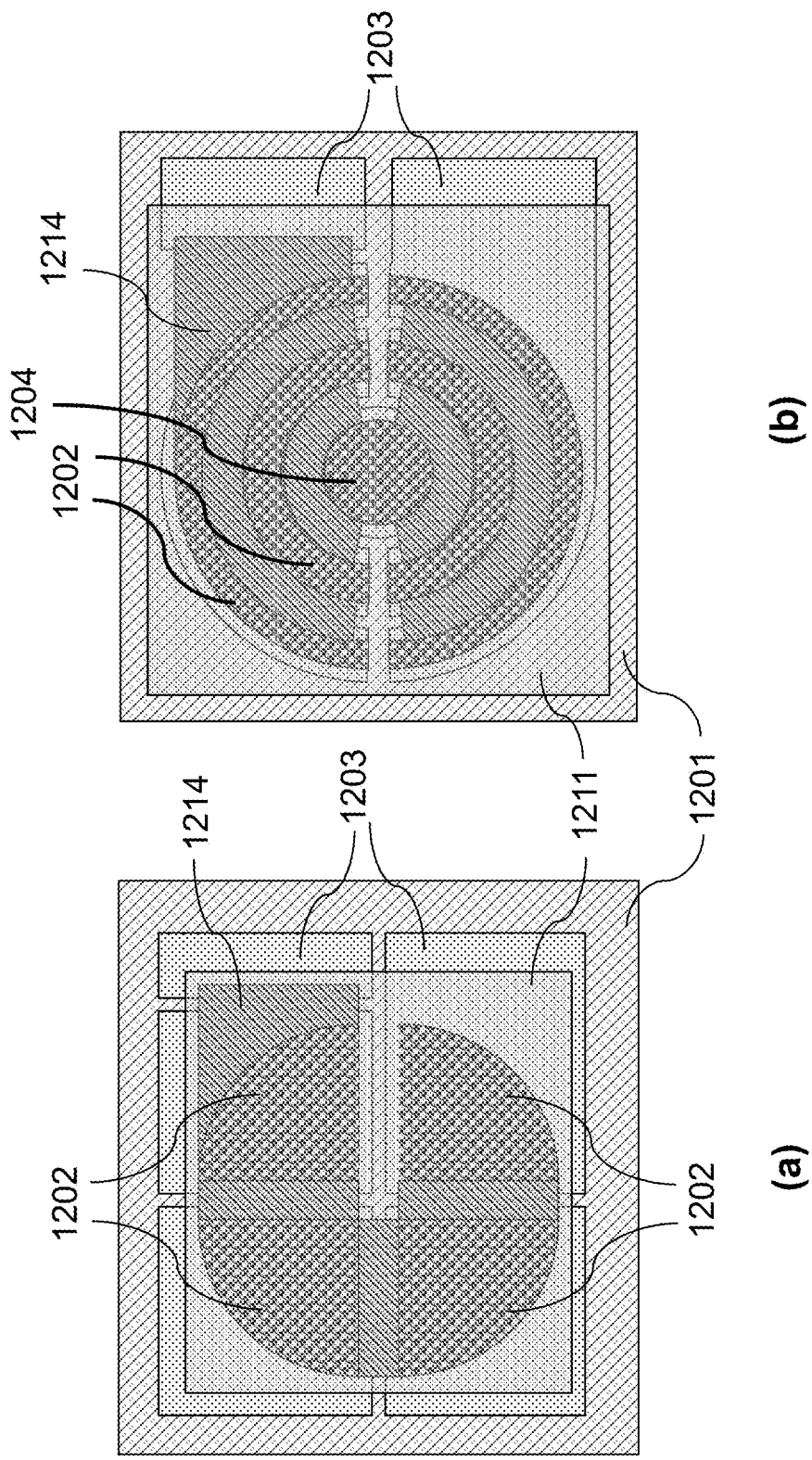
FIG. 12 is a schematic representation of VCSEL array module with circular emission areas comprising respectively, in a) a VCSEL array module with four quarter-circle emission areas, and b) a VCSEL array module with a combination of a circular emission area and a group of concentric half-rings.

It should be noted that the embodiments shown in FIGS. 10, 11 and 12 are described to have the array chips connected in series. This configuration is particularly suitable for low electrical current operation of the array module, yet delivering high optical output power. In general, the array modules may be first constructed on a common substrate with appropriate electrical connections between each array chip, either in series or in parallel, according to the output optical power requirement. The combined array module may then be bonded to a single transparent carrier substrate all at once. Alternatively, and in particular for array modules connected in parallel, individual array modules may be connected separately one by one or in smaller groups, to the carrier substrate. These different choices have been described earlier with reference to FIG. 8.

It should also be noted that the carrier substrate shown in FIGS. 10, 11 and 12 functions as a simple transparent optical window. It need not be so in all applications. As described in reference with FIG. 7a-7c, the top surface of the transparent carrier substrate may further include additional optical elements such as a diffuser, a single lens, a microlens array, etc., to provide beam shaping. The optical elements may be arranged on the entire surface of the transparent window or may be placed in other arrangements according to the beam shaping requirements pertaining to each application. While only a few exemplary alternatives are shown and described, other variations may be apparent to those skilled in the art and may be practiced within the framework of this invention.

VCSEL Array Illuminator Module

The surface mountable VCSEL array modules described in the previous section are particularly suitable for configuring illuminator modules. The array chips or array modules may be mounted on a large area high thermal conductivity base for example a thermal submount using metal-metal heat and/or pressure bonding methods well known in the art. The high thermal conductivity base comprises of materials that include but are not limited to, metal such as copper, aluminum, etc. or ceramics such as beryllium oxide (BeO), aluminum nitride (AlN$_3$), aluminum oxide (Al$_2$O$_3$), etc.

The surface mounted array modules in thermal contact with the large area high thermal conductivity base provide large surface for rapid heat dissipation that may be effected through air cooling, particularly for small illuminator modules, or by circulating liquid coolants in one or more microchannel cooler for rapid heat transfer. Different types of cooling arrangements that may be readily adapted for constructing illuminator module using the surface mountable array modules according to this invention, are described in the pending U.S. patent application Ser. No. 13/369,581 filed on Feb. 9, 2012, by van Leeuwen et al. issued as the U.S. Pat. No. 8,576,885 on Nov. 5, 2013, which is co-authored (by some of the applicants). That description is being incorporated by reference in its entirety.

Figure 13:
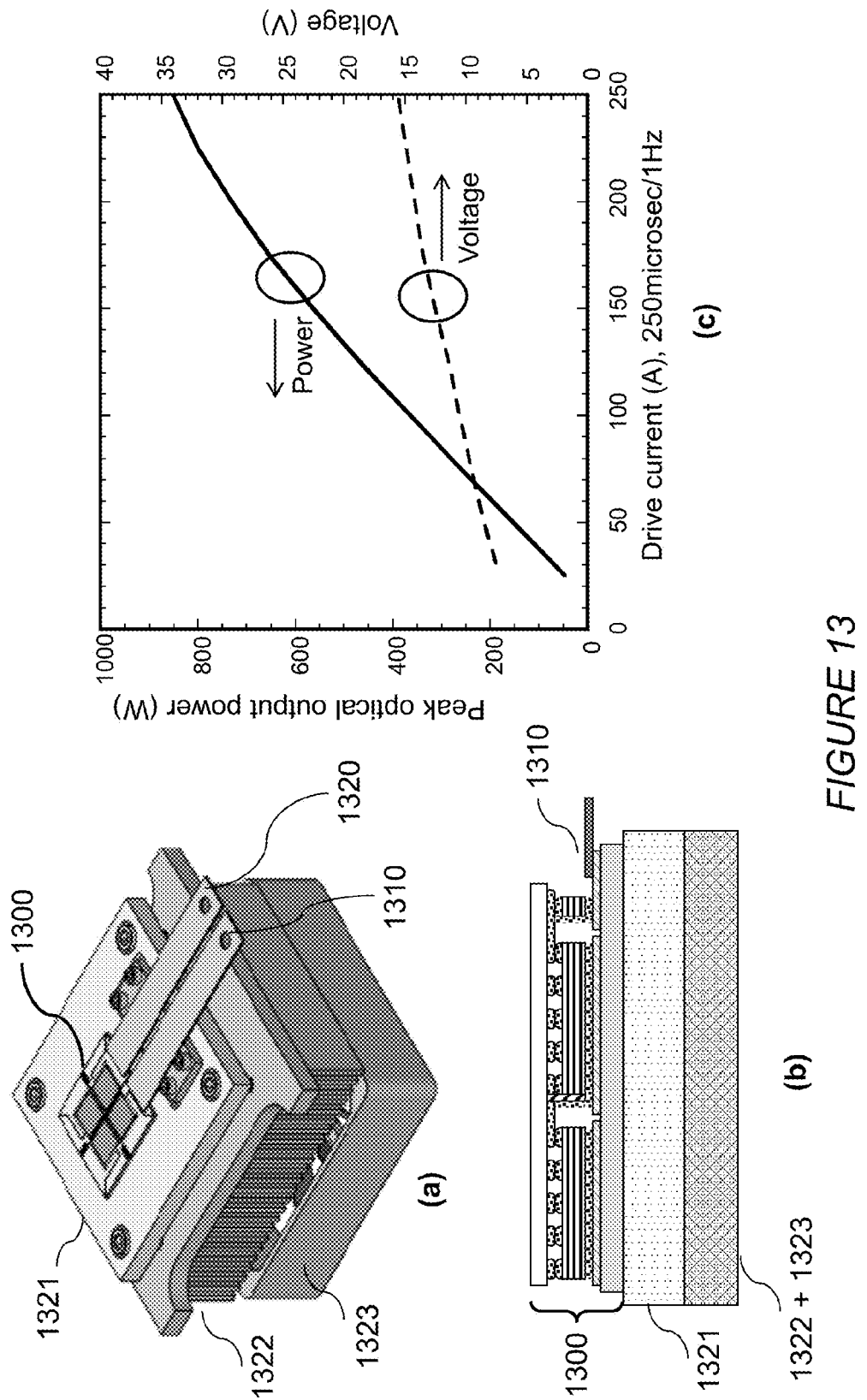
FIG. 13 represents respectively, a) an optical illuminator module, b) cross section view of the module, and c) performance characteristics.

In the following sections, several exemplary embodiments of illuminator modules will be described that utilize array chips or array modules configured according to the principles described in the previous sections. An array module having four VCSEL array chips described earlier with reference to FIG. 10 is assembled to construct an illuminator module constructed according to this invention shown in FIG. 13. More specifically, FIG. 13a shows a VCSEL illuminator in isotropic view and a cross section view of the illuminator is shown in FIG. 13b. The elements that are substantially similar are labeled using same reference numerals. The illuminator module shown in FIG. 13 includes an array module 1300 that is substantially similar to the array module 1000 described with reference to FIG. 10. That description will not be repeated. The array module includes electrical leads 1310 and 1320, connected to the two terminals of the array module, respectively.

In this embodiment of the illuminator module, the surface mountable array module 1300 without any wire or ribbon bonding is directly mounted on a copper heat sink 1321. The heat sink further includes a set of cooling fins 1322 (not visible in FIG. 13b) to facilitate rapid heat transfer by air circulation from a fan 1323. One advantage of direct surface mounting described in this example is to avoid device failure due to snapping of wire or ribbon bonding.

FIG. 13c shows performance characteristics of an illuminator module similar to the one shown in FIG. 13a. More specifically, device voltage (on the right hand side Y-axis) is plotted (dashed line plot) as a function of applied drive current α-axis) and the output optical power (on the left hand side Y-axis) is plotted (solid line plot) as a function of applied drive current in the graph in FIG. 13c. The data shown in this graph is obtained for a quasi continuous wave (QCW) operation. The exemplary illuminator module produces about 800 W of optical power by applying 250 A current at a 200 microsec/1 Hz duty cycle. It is noted that the voltage and slope efficiency are characteristic of the entire array module including the four arrays connected in series. One advantage of QCW operation is that the device life is extended significantly. The operating conditions described here is exemplary and it should be noted that the illuminator module may also be operated in pulsed or CW mode operation, albeit with different performance.

Figure 14:
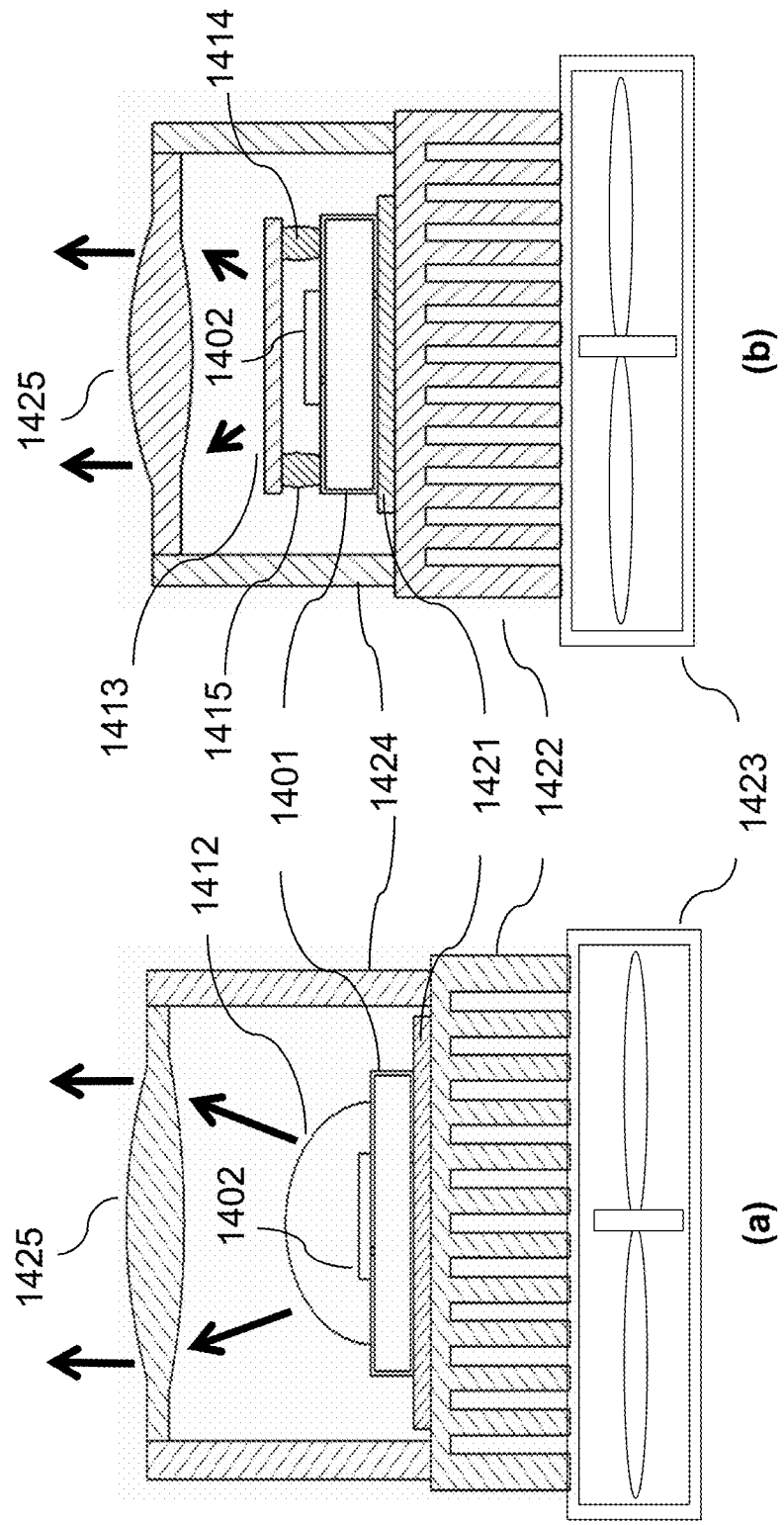
FIG. 14 schematically represents exemplary air cooled optical illuminator module encapsulated with an optical component comprising respectively, a) encapsulated lens protected VCSEL array module chip and b) encapsulated surface protected VCSEL array module chip.

Small air cooled illuminator modules shown in FIGS. 14a and 14b may be assembled using encapsulated array modules. Encapsulated array modules were described in reference with FIGS. 9a and 9b. Substantially similar elements in the modules described in FIGS. 14a and 14b are labeled using same reference numerals. More specifically, an array module 1400 is bonded to a submount 1401 which may be a thermal submount or a PCB submount as has been described earlier. Any array module described with reference to FIGS. 4, 5, 6, 7 and 8 may be used to configure the illuminator module. In FIG. 14a, the array module is encapsulated on the submount using a polymer encapsulation in the shape of a lens. Depending upon the application, alternative encapsulation may be used for providing other types of optical functions such as a diffuser.

One example of an alternative encapsulation is shown in FIG. 14*b*. A flat transparent plate 1413 is bonded to the submount 1401 using metal or polymer spacers 1414 and 1415, respectively, placed at a desired separation between the array module and the transparent plate. The transparent plate may include additional optical elements similar to those described in reference with FIG. 7. It can be appreciated that the array module may be encapsulated integrated with control and drive electronic circuits on a PCB as shown in FIG. 9*c* (where control and drive electronics are not visible in that particular view).

The encapsulated array module is bonded preferably to a metallic heat sink 1421 for example, a copper heat sink including a plurality of cooling fins 1422. The heat sink is cooled using a fan 1423 placed in close proximity. Additionally, the encapsulated array module may optionally be housed in a protective housing 1424 with an optical element 1425 facing the emission surface of the array module. The optical element may be selected to provide a desired functionality such as a focusing lens, a collimator, etc., so as to direct the emission from the array module over a particular area and/or in a particular beam shape. For example, a diverging beam emission in this embodiment is collimated (shown by the bold arrows in FIGS. 14*a* and 14*b*) to emerge more uniform within a small area.

Figure 15:
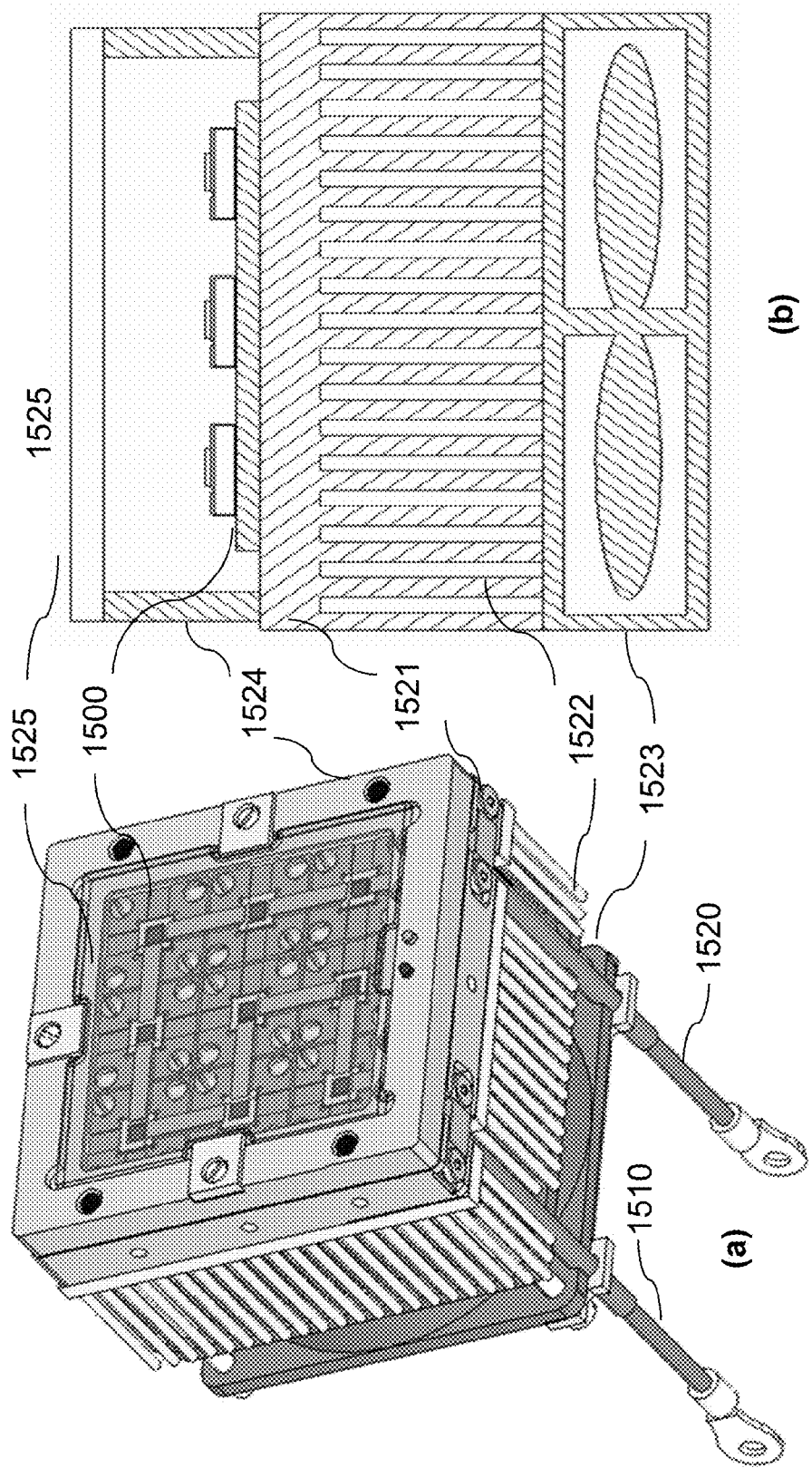
FIG. 15 shows a) an exemplary air cooled high power optical illuminator module comprising 9 VCSEL array module chips, and b) a schematic cross section view of the optical illuminator.

An exemplary illuminator module for providing high optical output power is shown in FIG. 15. In particular, FIGS. 15*a* and 15*b* respectively, show an isotropic view and a cross section view of one embodiment of an illuminator module configured for high output optical power. The elements labeled with the same reference numerals in FIGS. 15*a* and 15*b* are identical or provide substantially similar function. More specifically, in FIG. 15*a* an array module 1500 is constructed using nine square array chips connected in series. The array chips are connected to a current source driver via a pair of high current capacity electrical leads 1510 and 1520. The electrical leads are not shown in the cross section view in FIG. 15*b*.

In this particular illuminator module, a 3×3 array pattern is configured using nine array chips constructed monolithically on a common substrate and electrically connected in a desired configuration (in series in this particular embodiment, for example) using connectors provided on a transparent carrier substrate as has been described earlier in reference with FIGS. 10, 11 and 12. Individual modules may be diced and bonded to a common substrate. The common substrate (not shown here separately) may include but is not limited to, a thermal submount, a ceramic substrate with metal contacts, a PCB, etc. A heat dissipation device 1521 including a plurality of cooling fins 1522 is provided for air cooling the array module with a fan 1523. As an option, a protective housing 1524 including a transparent window 1525 may additionally be provided for protecting the optical module. While this particular embodiment is shown only with a protective window 1525, additional optical elements as described in reference with FIG. 7 may be further provided for additional beam shaping requirements.

Figure 16:
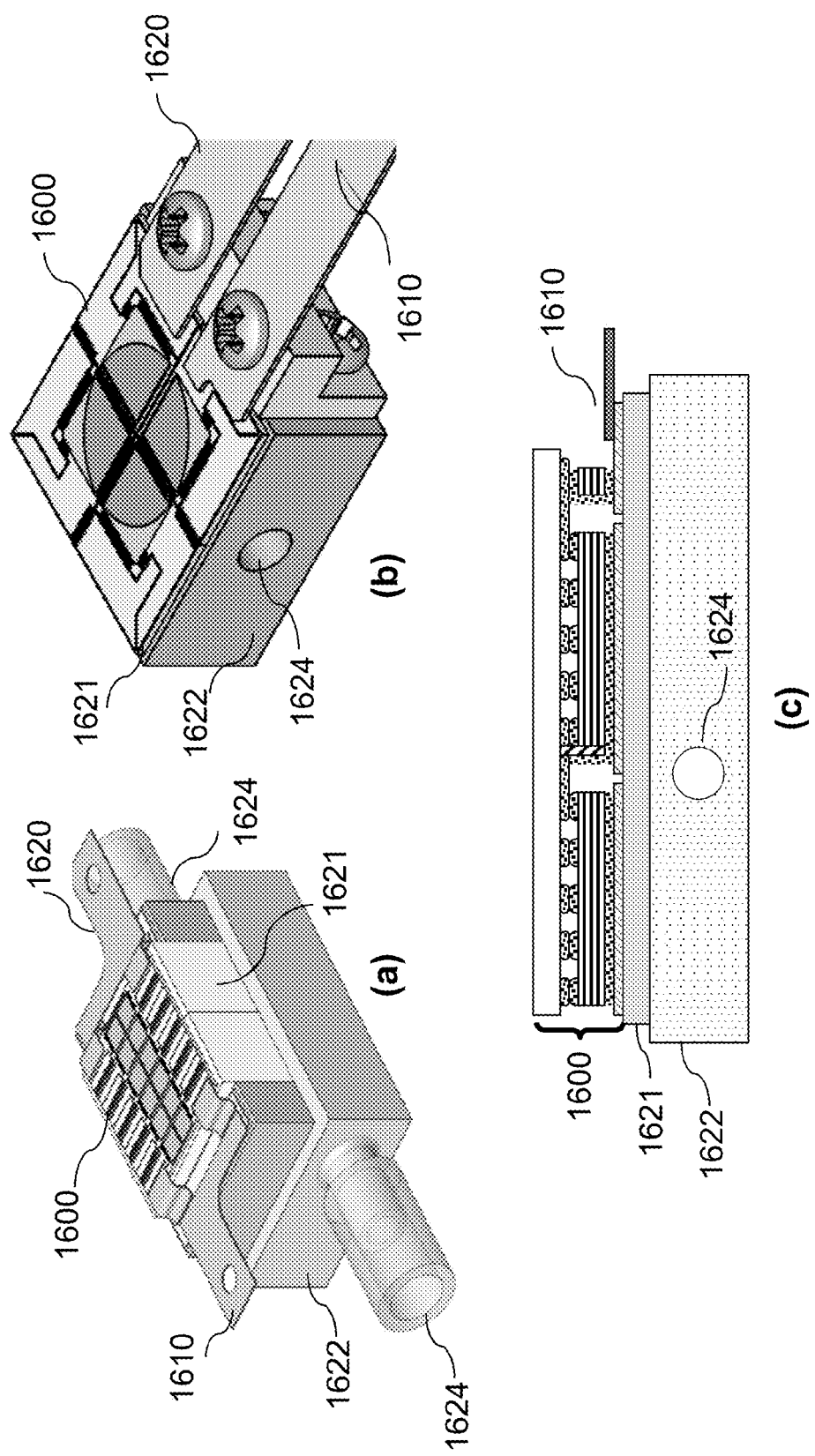
FIG. 16 shows exemplary liquid cooled optical illuminator modules comprising respectively, a) a side-by-side VCSEL array module chip, b) a circular VCSEL array module chip, and c) a cross section view of the module.

For array modules configured for higher output power, other cooling methods are preferable. In one embodiment of the invention liquid cooled micro channel coolers may be used to provide rapid heat dissipation. Examples of liquid cooled illuminator modules are shown in FIG. 16. In FIG. 16*a*, the module 1600 comprising array chips arranged in a 2×6 pattern having electrical contacts 1610 and 1620 on two opposite ends is shown. The array module is substantially similar to the one described with reference to FIG. 11*b* and that description will not be repeated. The finished array module is assembled on a thermal including a pair of microchannel coolers 1621 that are attached to a manifold 1622 including inlet and outlet ports 1624 to circulate a liquid coolant.

The embodiment shown in FIG. 16*b* is similar to the one shown in FIG. 16*a* except for the array module 1600. In that example, a circular array module substantially similar to the one shown in FIG. 12*a* is assembled on a submount 1621. The two electrical contacts for the array 1610 and 1620 are located side by side. The submount is substantially similar to the one shown in FIG. 13*a* as well. The submount in this example is bonded to a liquid cooled heat sink 1621 having an inlet and outlet port 1624 (only one visible in this view). Details of the illuminator modules shown in FIG. 16*b* are more clearly visible in the cross section view shown in FIG. 16*c*. The array module collectively labeled as 1600 is bonded to a submount 1621. In this view only one electrical contact 1610 to the array module is visible. The entire assembly is then bonded to a heat sink 1622 having an arrangement for circulating a liquid coolant through a port 1624. While the embodiment is described using a simple liquid cooled heat sink, illuminators having larger array modules may be assemble with other types of liquid cooled heat sink that are well known in the art.

And while the packaging of the high optical power illuminator module shown in FIG. 15 is different from a low optical power illuminator module described earlier with reference to FIGS. 13 and 16, where the transparent window is bonded to the array module itself, the basic principles of constructing the illuminator modules are still the same. In variant embodiments, the window 1525 or equivalent (1011, 1111, 1211, respectively in FIGS. 10, 11 and 12) in the embodiments using smaller array modules may include but is not limited to, a diffuser surface, additional optical elements such as a lens or an array of microlenses, etc. that were described earlier with reference to FIG. 6. The diffuser surface may be designed to provide optical functions to suit particular application for example, random scattering, or providing optical diffraction or holographic surface for increasing divergence, etc. just to name a few.

Figure 17:
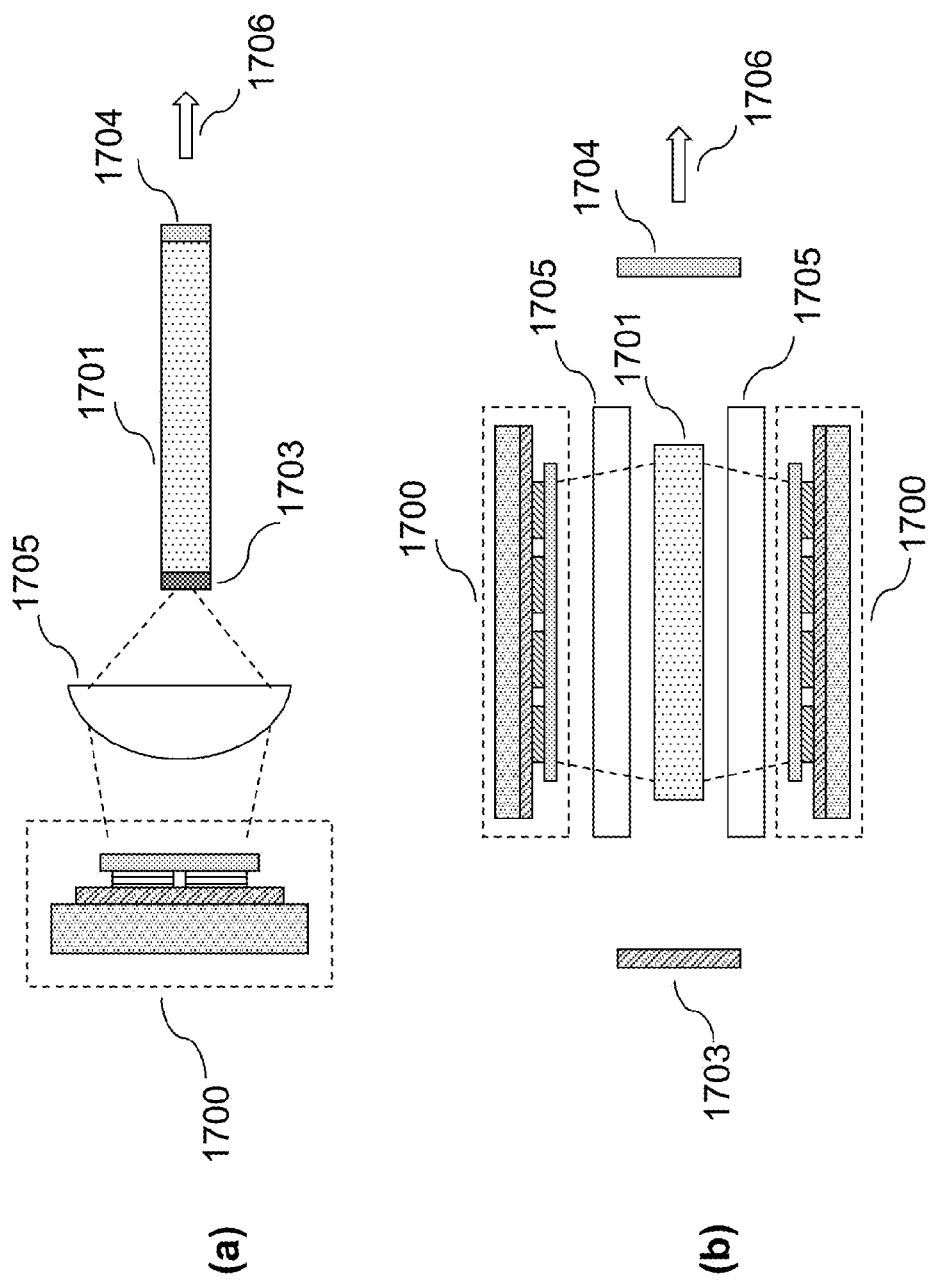
FIG. 17 shows application of optical illuminator module in optical pumping of gain medium: a) end pumping configuration, and b) dual side pumping configuration.

The illuminator modules constructed according to the principles described above, provide high optical output power in a small foot print and are readily adaptable for pumping solid state gain medium, for example in a solid state laser system. FIG. 17 schematically shows gain medium pumping arrangements that utilize illuminator modules configured according to this invention. In particular, FIG. 17*a* shows an end pumping arrangement to pump a solid state gain medium 1701. The gain medium in this example is in the form of a bar (rod or a slab) with the end surfaces 1703 and 1704 forming a resonant cavity. The end surface 1704 having a partially reflective surface forms the output side in this particular example where the laser output 1706 exits.

Pump light from an illuminator module 1700 is focused on one end of the gain medium using a focusing device 1705 for example a lens in this particular arrangement. Other well known methods to concentrate light on to the end surface of the gain medium may include optical elements either alone or in predetermined combinations. An illuminator module shown in FIG. 16*b* comprising a circular array chip or array module similar to the one described in reference with FIG. 12 would be most suitable for this particular application. While this exemplary embodiment is used to demonstrate the principle, a gain medium may also be pumped on both ends as has been described in the co-pending U.S. patent application Ser. No. 13/369,581 filed on Feb. 9, 2012, by van Leeuwen et al.

issued as the U.S. Pat. No. 8,576,885 on Nov. 5, 2013, the contents of which is being incorporated by reference in its entirety.

FIG. 17b shows a different arrangement to pump a solid state gain medium from the sides that are parallel to the lasing axis of the gain medium. More specifically, a gain medium 1701 is placed between two reflectors 1703 and 1704, where the reflector 1704 is configured to be the output end for the laser light 1706 to exit the cavity. Two illuminator modules 1700 placed on two opposite sides of the gain medium focus pump light along the length of the gain medium using focusing optics 1705. Focusing optics may be a simple lens or other combinations that are well known in the art. An illuminator module shown in FIG. 16a comprising a rectangular array module similar to the ones described with reference to FIG. 11 would be most suitable for this particular application. While this exemplary embodiment is used to demonstrate the principle, a gain medium may also be pumped only from one side of the gain medium as has been described in the co-pending U.S. patent application Ser. No. 13/369,581 filed on Feb. 9, 2012, by van Leeuwen et al. issued as the U.S. Pat. No. 8,576,885 on Nov. 5, 2013, the contents of which is being incorporated by reference in its entirety.

Those skilled in the art will be able to appreciate the degree of flexibility available within the broad framework of the principles described for configuring illuminator modules for pumping a gain medium. For example, an illuminator module may be configured to conform to the shape and/or size of the gain medium by appropriately designing an array chip and/or array module suitable for a particular shape of the gain medium to be pumped. In fact, the same idea may be extended to construct an illuminator to illuminate any surface having a regular or an irregular geometrical shape. Furthermore, pump power of an illuminator module may be increased in a modular fashion by constructing larger array chips, adding more array chips in an array module, or by providing more modules to extend the area of the illuminator module. Other possible variations would provide a wide range of design choices within the broad framework of the principles of this invention that in configuring a wide variety of illuminator modules to those skilled in the art.

System Level Integration of VCSEL Array Module

One important aspect of the surface mountable VCSEL array chips and array modules is that they may be easily integrated with electronic circuits on a common platform to configure stand alone illuminator modules or complete systems and devices in applications including but not limited to, continuous wave (CW) or quasi continuous wave (QCW) illumination, pulsed illumination, LIDAR applications, imaging, 3D gesture recognition, medical applications such as hair removal, wrinkle removal, photodynamic therapy and fat removal, signal flare, automobile ignition, just to name a few. The electronic circuits may include a simple current driver circuit to operate an array module or more complex control and processing circuits for application in complete systems.

Figure 18:
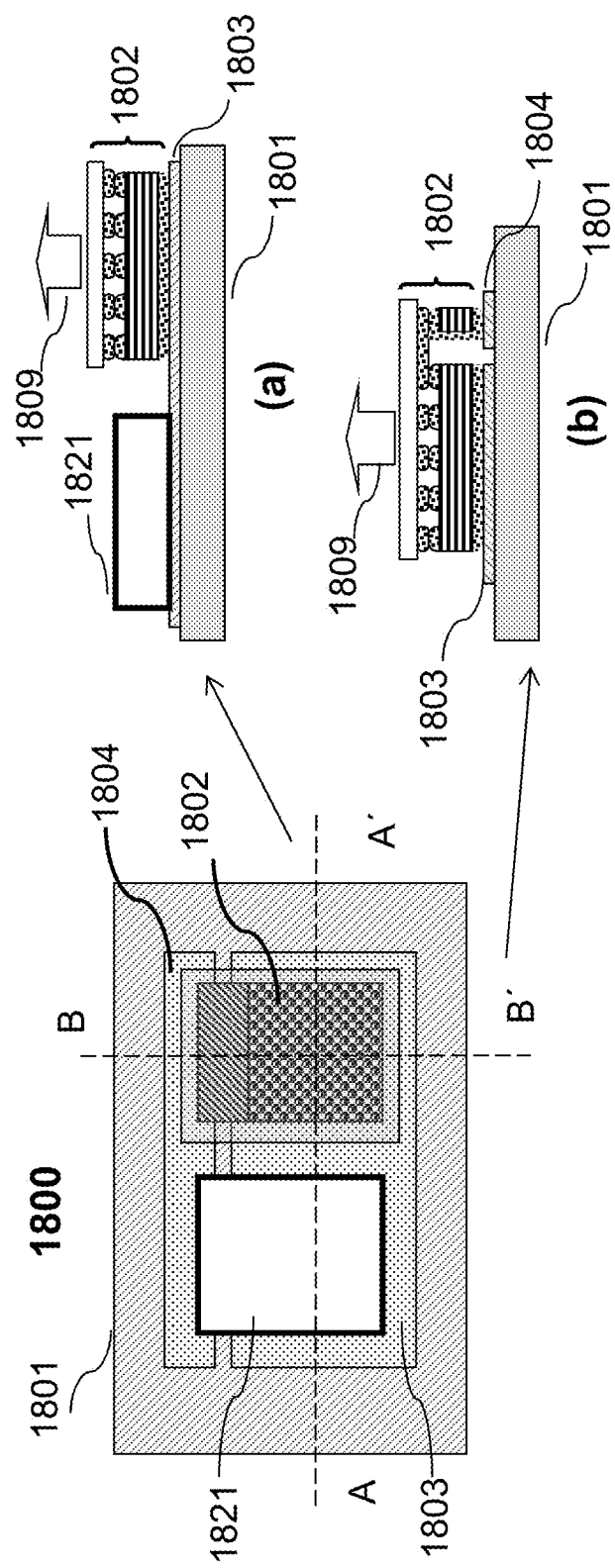
FIG. 18 schematically shows a surface mounted optical illuminator module co-located with an electronic circuit on a thermal submount: a) planar view, b) and c) cross section views, respectively.

An exemplary embodiment to explain the principles of a simple stand-alone illuminator module is shown in FIG. 18. More specifically, a schematic view 1800 depicts a planar view of the illuminator module including a surface mountable array module 1802 and an electronic circuit 1821, respectively. The surface mountable array module 1802 may be similar to the one described in reference with FIGS. 4, 5, 6, 7 and 8, or may be a surface mountable array chip, similar to the ones described in reference with FIGS. 2a-2d. The electronic circuit in this particular example is a current driver to power the array module. The electronic circuit is electrically connected to the array module using metal bonding pads (or traces) 1803 and 1804, respectively, located on the same side of a high speed PCB 1801. One advantage of integrating the array module with the current driver is to provide lower inductance and capacitance for the connecting leads resulting in very fast rise and fall time operation of the illuminator module.

FIGS. 18a and 18b show cross section views of 1800 along two different projection lines AA' and BB', respectively, selected at right angles to each other. For clarity, same reference numerals are used to label identical elements. In FIGS. 18a and 18b, the array module is collectively shown with the bracket 1802. The array module and the electronic circuit may be surface mounted on the PCB at the respective metal pads 1803 and 1804 located on the same surface of the PCB, using heat and/or pressure bonding methods well known in the art. Notably, no wire or ribbon bonding of the contacts from the top surface of the array module or the electronic circuit is necessary, thereby reducing the risk of electrical contact failure, and in particular for high output power illuminators where rise in temperature at the contact points can be quite high.

The array module in this exemplary embodiment is shown with a single square array chip; however, other configurations having multiple array chips (shown in FIGS. 10, and 11) may also be used for obtaining higher optical power illuminator modules. The choice of the common platform may be decided by the size of the illuminator and requirement for heat removal. For example, the PCB may be mounted on a heat sink comprising a high thermal conductivity material. For a high output power device, the common platform may be a PCB constructed form a high thermal conductivity material for rapid heat dissipation.

Figure 19:
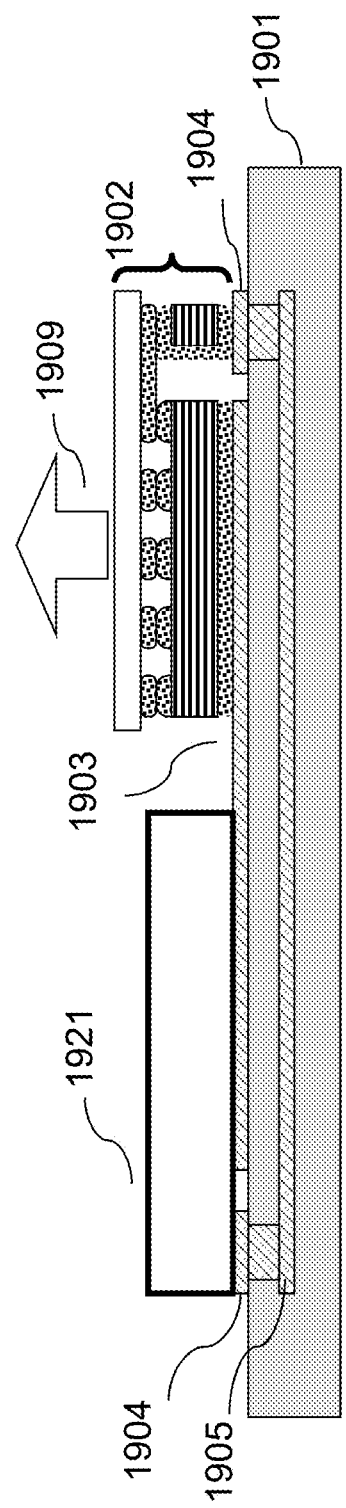
FIG. 19 shows a schematic cross section view of a surface mounted optical illuminator module co-located with an electronic circuit on a multi-level printed circuit board.

For higher degree of integration, for example where multiple electronic circuits are to be integrated with one or more array modules, multi-level PCB may be used. One such example is shown in FIG. 19. For clarity, the embodiment is shown to include an array module and a current driver circuit similar to the example shown in FIG. 18. However, same principles may be extended to a higher level of integration. In particular, an array module 1902 shown collectively with a bracket, and a current driver circuit 1921 are surface mounted on a PCB 1901 having multi-level tracks. The array module is connected to the electronic circuit using a common bonding pad 1903 located on one level of the PCB, whereas the second bonding pad 1904 is connected using a track 1905 located at a lower level, respectively.

This aspect is particularly useful in applications where multiple electronic circuits have to be connected with one or more array modules. Additional advantage of this configuration is that heat dissipation of the module can be more efficient. For example, the tracks carrying higher current may be located at a level that is closer to the heat sink, whereas the tracks carrying low current signals for example, signals providing sensor or control functions may be located on a surface further away from the heat sink. Those skilled in the art will be able to appreciate the flexibility in design options provided within the broad framework of this invention is enormous, especially for high optical power illuminator modules. Design choices in this invention in constructing optical illuminators conforming to different shapes and sizes of areas to be illuminated to suit a wide range of applications. A few examples of high level integration using optical modules described earlier will now be presented.

Figure 20:
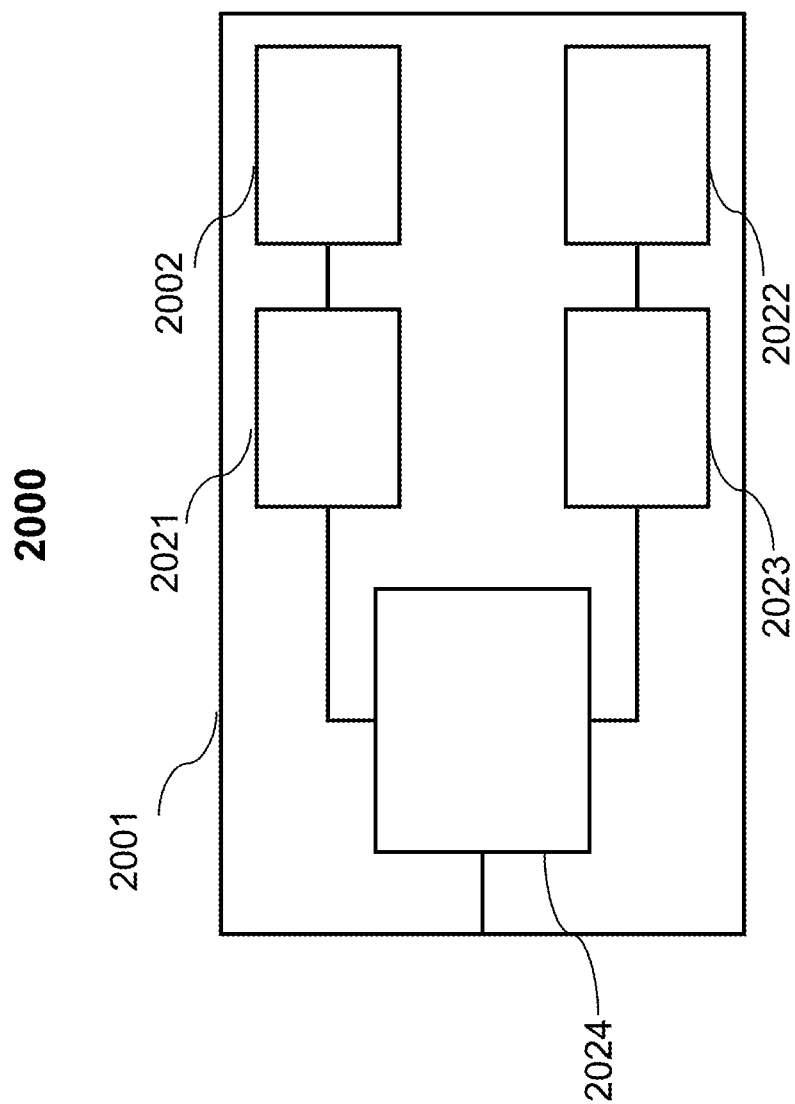
FIG. 20 shows a schematic planar view of a surface mounted optical device comprising an optical illuminator module and an optical sensor module surface mounted with other electronic circuits on a common printed circuit board.

One example of a schematic representation of a high level integration is shown in FIG. 20. More specifically, one or more array modules with a plurality of electronic circuits to provide different functionalities may be configured on a PCB having multiple conductor layers. A planar view 2000 of an integrated illuminator system shown in FIG. 20, comprises an array module 2002 integrated with a current driver circuit 2021 on a common PCB 2001, similar to the one described with reference to FIGS. 18 and 19. In addition, an optical sensor or a camera module 2022 along with its driver circuit 2023 and a microprocessor device 2024 is integrated with the array module to assemble a compact motion or gesture recognition apparatus.

Figure 21:
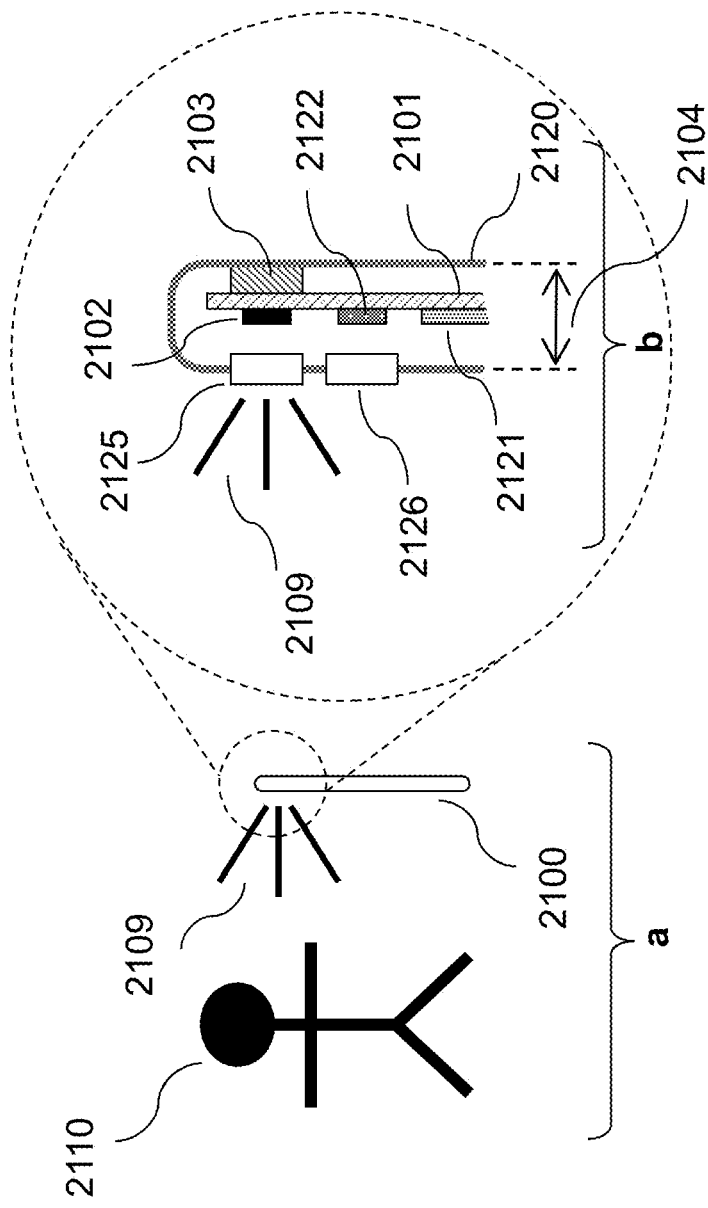
FIG. 21 is a schematic representation of a motion detection apparatus comprising a surface mounted optical device including an optical illuminator module configured according to this invention.

In one embodiment of the invention a motion or gesture recognition apparatus in a relatively thin form factor is shown in FIG. 21. This embodiment is particularly useful for applications in consumer devices that include but are not limited to, cell phones, tablet computers, computer monitors, digital watches, portable digital media players, etc. to name a few. The apparatus and its expanded view are shown in FIGS. 21a and 21b, respectively. The apparatus is enclosed in an enclosure 2100 that is 15×20 cm² in area and is typically ≤0.5 inches thick as shown by the double headed arrow 2104 in FIG. 21b. The light emitted from the apparatus 2209 illuminates a subject 2110. For example, in a gesture recognition application the object that is illuminated is a face of a person. However, the application is not restricted to facial gesture and may be applied to detect any other gesture or motion.

The principle of operation of the apparatus may be understood with reference to the expanded view of the apparatus shown in FIG. 21b. The apparatus 2100 comprises an illuminator module 2102 integrated with an imaging sensor or a camera device 2122 and an electronic circuit(s) 2121 surface mounted on a common PCB 2101. The PCB may optionally be mounted on a thermally conductive mount 2103. The PCB with all the components is enclosed in a housing 2120 including two windows 2125 and 2126 aligned respectively with the illuminator module (emitting window) and the sensor or camera device (receiving window), respectively.

The VCSELs devices in illuminator module may be arranged in a pre-determined pattern which defines a grid of emitted light as will be described shortly. The emitted light 2109 from the illuminator module is magnified using optical elements and projected on to the subject in a known pattern. The light reflected from the subject is directed using collection optics, through the transparent window 2126 to the imaging sensor or the camera device. The reflected light is detected by the imaging sensor device and analyzed to determine subject position and any changes due to movement.

Figure 22:
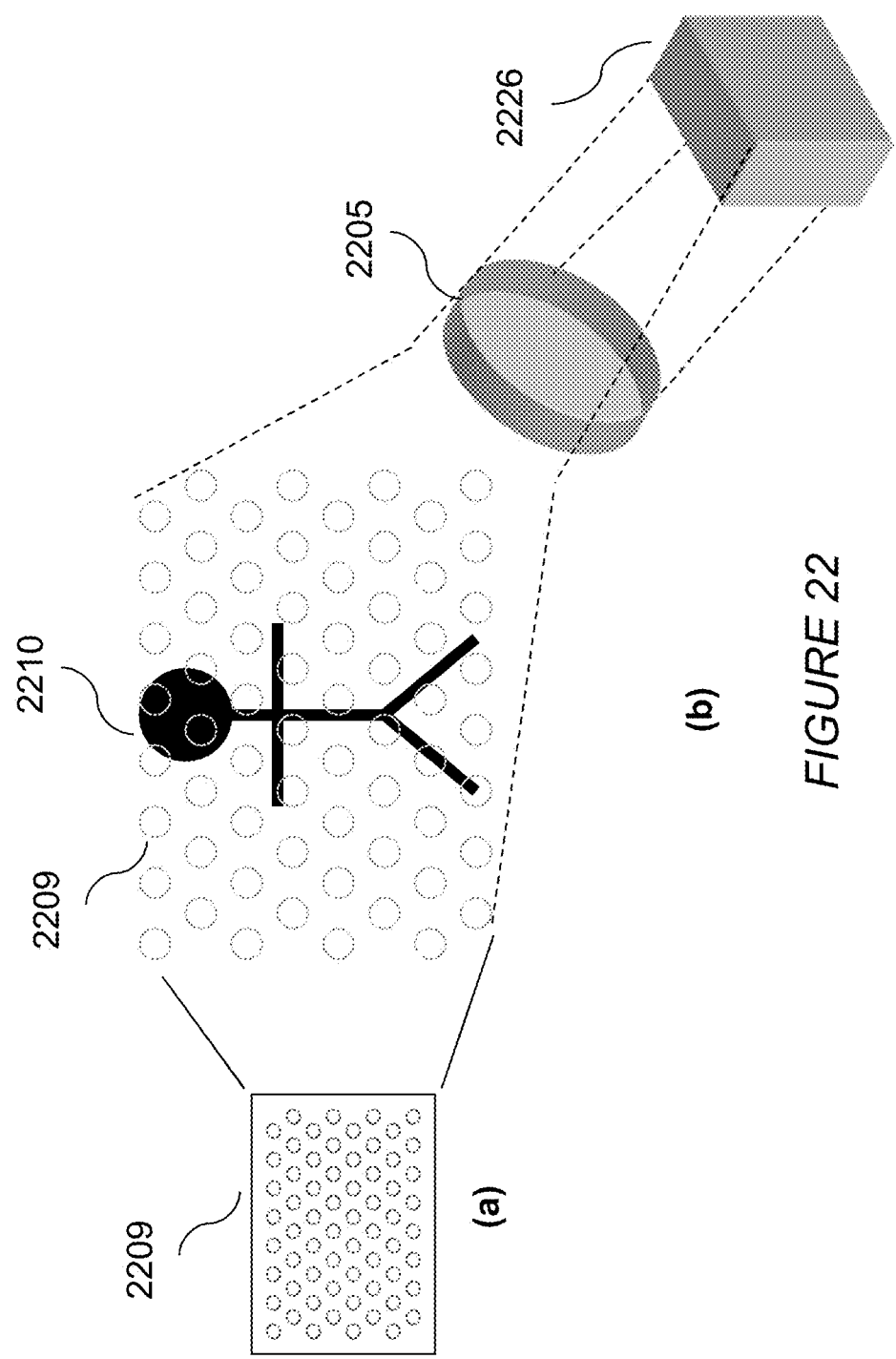
FIG. 22 is a schematic depicting principles of a motion detection apparatus using a surface mounted optical device including an optical illuminator module configured according to this invention.

A more detail drawing of the emitted light from the illuminator module is shown in FIG. 22. More specifically, FIG. 22a shows a detail grid pattern of emitted light 2209 from the illuminator module, and FIG. 22b shows a schematic view of the detection system including receiving optics 2205 and the receiving window 2226, respectively. The receiving optics may be a simple focusing lens or may include other optical elements that may be separate or integrated with the receiving window, the imaging sensor or the camera device behind it. Referring now simultaneously to FIGS. 21 and 22, in the absence of a subject 2210 within the illuminated area 2209, the imaging sensor would image the grid pattern 2209 of the illumination area.

A reference image of each element of the grid pattern of the illumination area is thus recorded and stored in a processor (not shown) included in the electronic circuit(s) of the apparatus. In the presence of the subject, the imaging sensor would register the changes in the reflected light from the subject, thereby imaging the subject. Any change in the reflected light due to movement will be recorded and compared with the reference image to detect motion or gestures. The recording and image processing may be performed real time or using stored data in the processor. It can be easily appreciated that the compact form factor and portability of the apparatus described here is particularly advantageous in field applications.

Figure 23:
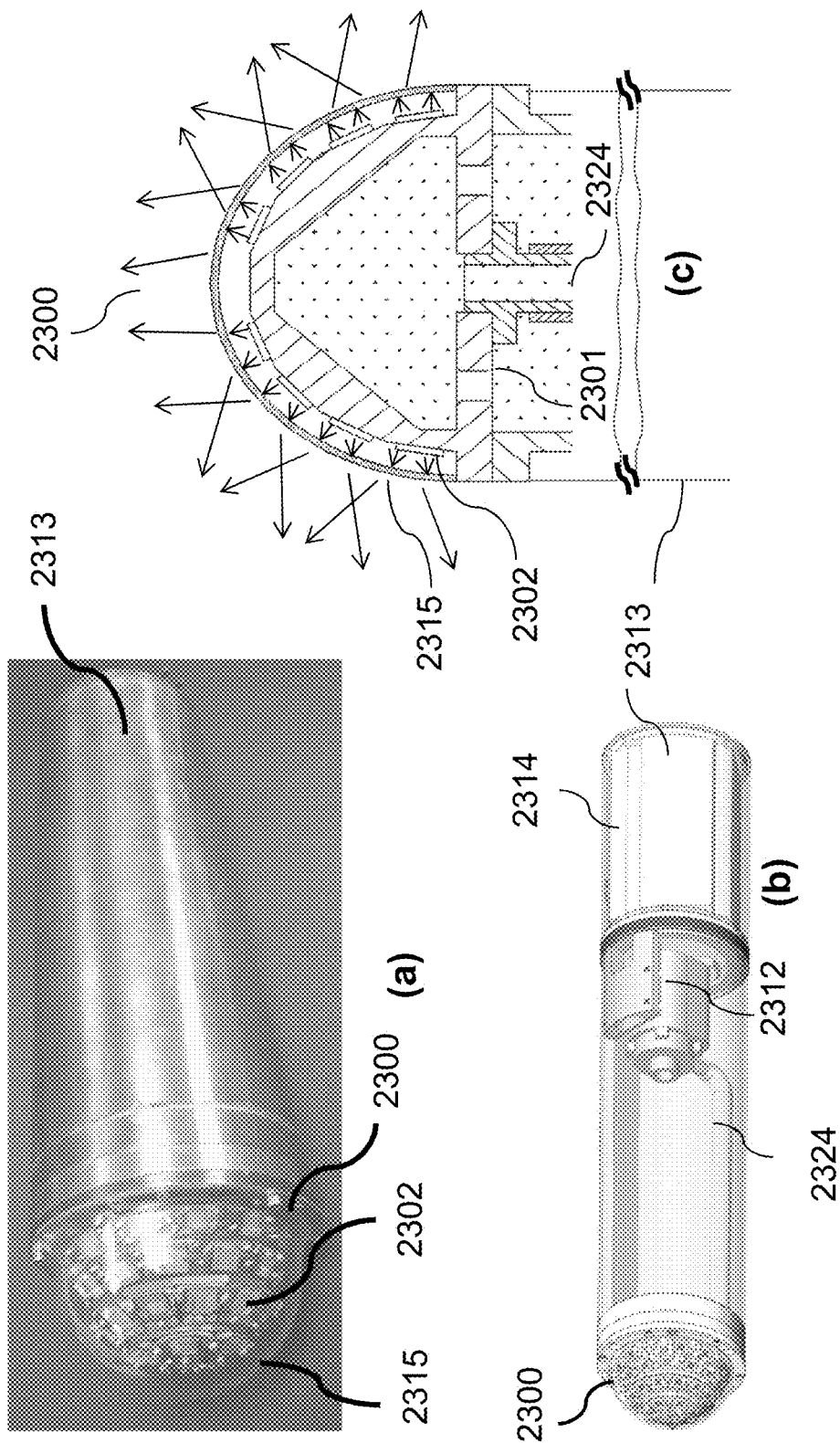
FIG. 23 shows an exemplary portable optical illuminator device with a hemispherical illumination head configured according to this invention.

One aspect of the present invention is that the surface mountable array modules may also be configured in three-dimensional form. One objective of the invention is to provide an illumination head in a desired 3-D geometry, for example a sphere, a hemisphere, a parallelepiped, a cube, a cone, a pyramid, or any other shape that can be visualized by those skilled in the art. In one embodiment of the invention a portable illuminator shown in FIG. 23 is provided. More specifically, FIG. 23a shows the outer structure, 23b shows a cross section depicting the internal parts and 23c shows schematic of the illuminator including the VCSEL chip arrays of the portable illuminator to particularly highlight different distinctive aspects of this particular embodiment. In different views of the embodiment, elements that are substantially similar are labeled using the same reference numerals for clarity of description.

In particular, the portable illuminator as shown in FIG. 23a comprises a cylindrical enclosure 2313, one end of which includes a dome shaped (hemispherical) illuminator module head 2300. While this particular example shows a hemispherical dome shaped illuminator head, the design is adaptable for other head geometry without digressing from the basic design principles. The illuminator module head includes a plurality of VCSEL array chips 2302 (visible only in FIGS. 23a and 23c) located on its outer surface. For efficient heat transfer from the array module, a pump 2312 (visible only in FIG. 23b) enclosed within the cylindrical housing directs water through a cooling tube 2324 against a water cooled heat sink 2301 located at the inner surface of the module head. A battery housing 2314 (visible only in FIG. 23b) is located on the end of the enclosure, opposite to the illuminator module head. The pump, cooling tubes and the battery housing are all physically secured to the cylindrical enclosure.

A transparent protective cover 2315 protects the illuminator module head. In one aspect of the invention the transparent cover may be configured to provide additional optical functions. For example, in this particular embodiment, thin sheets of optical diffuser are integrated into the protective cover on the optical head. The protective cover therefore functions as a diffuser to increase the beam divergence and to homogenize the light emitted from the illuminator module head. Advantageously, the intensity distribution in the entire is over a large area. It should be noted that other beam shaping optical elements may also be used so as to generate an illumination pattern that is less intense at the center and more intense at the periphery of the illuminated area. Additional optical elements may be provided according to the application the portable illuminator would be employed for.

An exemplary portable device constructed according to this invention may have a typical diameter of about 2.75 inch and may be a 16 inches in length, and weighs considerably below 7 lbs providing an output power of ~300 W in a CW operation mode. With better cooling arrangement, an average output power of about 1 KW may be achieved in a pulsed or QCW mode operation. The small form factor of the portable illuminator allows airborne operation for providing uniform wide angle illumination over a large area for example, illuminating a scene in outdoor photography, videography or in surveillance applications just to name a few. Furthermore, the portable illuminator disclosed in this invention is scalable in a modular fashion, for obtaining higher output power, yet maintaining a relatively small form factor.

From the description provided in the previous sections, it can be appreciated that the principles of this invention may be applied to construct a wide range of devices having low or high output optical power for illuminating practically any shape and size of a surface. The modular aspect of design is particularly attractive for easy expansion and reducing manufacturing cost by producing the modules in large volumes. These and other advantages of the principles disclosed here will be apparent to those skilled in the art. And while the invention is described using surface mountable VCSEL arrays with no wire or ribbon bonded contacts, the overall principles may also be applicable where the emission side contact is wire or ribbon bonded to construct a surface mountable configuration.

Although a broad framework of the invention is described with reference to a few preferred embodiments, other embodiments may be configured by applying combinations and sub-combinations of elements described herein, depending on particular illumination application. Variations and modifications of different embodiments that will be apparent to those skilled in the art are within the scope of the invention and are covered by appended claims.

What is claimed is:

1. A portable illuminator comprising:
   a cylindrical enclosure, said cylindrical enclosure further including;
   an optical illuminator located on one end of the cylindrical enclosure, wherein the optical illuminator includes a plurality of VCSEL arrays mounted on an outer surface of a hemispherical member, said VCSEL arrays are electrically connected to emit light collectively;
   a transparent protective surface disposed on the outer surface of the hemispherical member for protecting the plurality of VCSEL arrays, wherein said protective surface further includes a diffuser surface for directing the emission beam from the plurality of VCSEL arrays into a uniform illumination pattern;
   a pump, said pump connected with a cooling tube to a liquid coolant source for providing a liquid coolant at high pressure, to an inner surface of the hemispherical member that is in physical and thermal contact with the plurality of VCSEL arrays located on the outer surface of the hemispherical member;
   a printed circuit board including one or more electronic circuits electrically connected to the plurality of VCSEL arrays;
   a battery chamber located at an opposite end from the hemispherical member for providing portable power source to operate the portable illuminator.

2. The portable illuminator as in claim 1, wherein each one of the plurality of VCSEL arrays further include:
   at least one array comprising a plurality of VCSELs, wherein all the VCSELs are configured to emit light in a direction perpendicular to an emission surface of the array, said emission surface further including a plurality of emission windows, each emission window substantially aligned with a respective VCSEL of said array, said array further including a first electrical contact located on the emission surface and a second electrical contact located on an opposing non-emission surface of the array, respectively;
   a trench located on the non-emission surface of the array, said trench for electrically isolating the array from an electrical contact region located on the non-emission surface;
   an electrically conducting path for providing electrical connectivity between the first electrical contact located on the emission surface and the contact region on the non-emission surface co-planar with the second electric contact, so as to facilitate surface mounting of the illuminator module; and
   a transparent carrier substrate disposed on the emission surface, said carrier substrate further including an electrical contact layer, wherein the electrical contact layer further includes a second plurality of windows substantially matching with the plurality of emission windows on the emission surface of the at least one array, such that the emission is directed out of the carrier substrate from a surface distal to the array module.

3. The portable illuminator as in claim 1, wherein the diffuser comprises thin sheets of optical diffuser.

4. The portable illuminator as in claim 1, wherein the one or more electronic circuit includes a current driver, an image sensor, a camera, a controller, and a processor or a combination thereof.

5. An optical illuminator comprising:
   a three dimensional illuminator head having a thermally conductive surface;
   a plurality of Vertical Cavity Surface Emitting Lasers (VCSEL) arrays mounted in thermal contact with the illuminator head, such that said plurality of VCSEL arrays cover the thermally conductive surface; and
   one or more electronic circuits electrically connected to the plurality of VCSEL arrays to emit light collectively in a direction that is away from the thermally conductive surface.

6. The optical illuminator as in claim 5, wherein geometric shape of the illuminator head is one selected from the group consisting of a sphere, a hemisphere, a parallelepiped, a cone, and a pyramid.

7. The optical illuminator as in claim 5, wherein the plurality of VCSEL arrays covers the thermally conductive surface completely so as to provide illumination along the surface of the illumination head.

8. The optical illuminator as in claim 5, wherein the plurality of VCSEL arrays covers the thermally conductive surface in a pre-determined geometrical pattern so as to provide a desired illumination pattern.

9. The optical illuminator as in claim 8, wherein different sections of the geometrical pattern are illuminated in a pre-determined timing sequence.

10. The optical illuminator as in claim 5 further including a heat dissipation device in physical contact with the illuminator head, wherein the heat dissipation device is cooled using a circulating fluid.

11. The optical illuminator as in claim 5, wherein the illuminator head is a hollow member comprising a geometric shape that is one selected from the group consisting of a sphere, a hemisphere, a parallelepiped, a cone, and a pyramid, and wherein the thermally conductive surface is the outer surface of the illuminator head.

12. The optical illuminator as in claim 11, further including a heat dissipation device, such that the heat dissipation device located in physical contact with the hollow region cools the inner surface of the illuminator head.

13. The optical illuminator as in claim 12, wherein the heat dissipation device includes a cooling tube in physical contact with the inner surface of the illuminator head in one or more places, said cooling tube is connected to a circulating cooling fluid source through a pump for pumping a cooling fluid at high pressure in the cooling tubes to cool the thermally conductive surface.

14. The optical illuminator as in claim 5, wherein, each one of the plurality of VCSEL arrays is monolithic, said monolithic array further including:
   a plurality of VCSELs emitting light collectively in a direction perpendicular to an emission surface of the array that comprises a plurality of emission windows in a first contiguous metallized layer located on the emission surface of the array, each emission window being substantially aligned with a respective VCSEL of said array, wherein said first metallized layer in electrical contact with the VCSELs provides a common first electrical contact, and a second metallized layer in electrical contact with the VCSELs and located on an opposing non-emission surface provides a common second electrical contact, respectively, to the at least one array;
   a trench located on the non-emission surface of the array, said trench electrically isolating the second electrical contact of the array from an electrical contact region located on the non-emission surface; and
   an electrically conducting path connecting the first electrical contact located on the emission surface to the electrical contact region located on the non-emission surface, such that the first electrical contact and the second electric contact are coplanar and accessible on the non-emission surface for surface mounting.

15. The optical illuminator as in claim 5, wherein the plurality of VCSEL arrays is supported on one or more thermally conducting submount to facilitate the thermal contact between said plurality of VCSEL arrays and the illuminator head.

16. The optical illuminator as in claim 5 further including an encapsulation disposed over the plurality of VCSEL arrays, said encapsulation having optional optical device that is one selected from the group consisting of a protective transparent window, a lens, a lens array, a diffuser, and a combination thereof.

17. The optical illuminator as in claim 5, wherein each one of the plurality of VCSEL arrays further includes:
   a plurality of monolithically constructed VCSELs that emit light in a direction perpendicular to an emission surface of the array chip, said emission surface further including a plurality of emission windows, each emission window substantially aligned with a respective VCSEL of said array, said array further including a first electrical contact located on the emission surface and a second electrical contact located on an opposing non-emission surface of the array, respectively;
   a trench located on the non-emission surface of the array, said trench for electrically isolating the array from an electrical contact region located on the non-emission surface;
   an electrically conducting path for providing electrical connectivity between the first electrical contact located on the emission surface and the contact region on the non-emission surface co-planar with the second electric contact, so as to facilitate surface mounting of the illuminator module; and
   a transparent carrier substrate disposed on the emission surface, said carrier substrate further including an electrical contact layer, wherein the electrical contact layer further includes a second plurality of windows substantially matching with the plurality of emission windows on the emission surface of the at least one array, such that the emission is directed out of the carrier substrate from a surface distal to the array module.

18. The optical illuminator as in claim 5, wherein the one or more electronic circuits include a current driver, a controller and a processor such that the optical illuminator is configured to function as a high intensity three dimensional continuous wave (CW), quasi-continuous wave (QCW) or a pulsed lighting source.

19. The optical illuminator as in claim 5, wherein the one or more electronic circuit includes a current driver, a controller, and a processor or a combination thereof.

20. The optical illuminator as in claim 19 further including an image sensor and a camera, such that the optical illuminator is configured to function as a three dimensional motion sensor or gesture recognition apparatus.

* * * * *